United States Patent
Satoh et al.

(10) Patent No.: US 9,368,756 B2
(45) Date of Patent: Jun. 14, 2016

(54) ORGANIC ELECTROLUMINESCENCE DEVICE AND METHOD OF MANUFACTURING THE SAME

(71) Applicant: Samsung Electronics Co., Ltd., Suwon-si, Gyeonggi-do (KR)

(72) Inventors: Ryuichi Satoh, Shizuoka (JP); Hiroshi Miyao, Kanagawa (JP); Tadao Yagi, Kanagawa (JP)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/052,008

(22) Filed: Oct. 11, 2013

(65) Prior Publication Data

US 2014/0103314 A1    Apr. 17, 2014

(30) Foreign Application Priority Data

Oct. 12, 2012  (JP) .................................. 2012-227483
Sep. 23, 2013  (KR) ........................ 10-2013-0112864

(51) Int. Cl.
*H01L 51/52* (2006.01)
*H01L 51/56* (2006.01)
*H01L 51/00* (2006.01)

(52) U.S. Cl.
CPC ........ *H01L 51/5275* (2013.01); *H01L 51/0096* (2013.01); *H01L 51/5268* (2013.01); *H01L 51/5271* (2013.01); *H01L 51/56* (2013.01); *Y02E 10/549* (2013.01); *Y02P 70/521* (2015.11)

(58) Field of Classification Search
None
See application file for complete search history.

(56) References Cited

U.S. PATENT DOCUMENTS

| | | | |
|---|---|---|---|
| 7,067,340 B1* | 6/2006 | Tsai et al. ...................... | 438/47 |
| 2004/0217702 A1 | 11/2004 | Garner et al. | |
| 2006/0138928 A1* | 6/2006 | Kim et al. ..................... | 313/400 |
| 2006/0186418 A1* | 8/2006 | Edmond et al. ................. | 257/79 |
| 2007/0187665 A1* | 8/2007 | Tada et al. ...................... | 257/10 |
| 2009/0153972 A1* | 6/2009 | Nakamura et al. ............ | 359/599 |
| 2012/0056208 A1* | 3/2012 | Nishikawa et al. ............. | 257/88 |

FOREIGN PATENT DOCUMENTS

| | | |
|---|---|---|
| JP | 10241856 A | 9/1998 |
| JP | 2003249353 A | 9/2003 |
| JP | 2003297572 B2 | 10/2003 |
| JP | 2008543074 A | 11/2008 |
| JP | 2009238507 B2 | 10/2009 |
| JP | 2011233288 A | 11/2011 |
| JP | 2011233289 A | 11/2011 |
| JP | 2011243625 A | 12/2011 |
| KR | 1020120044675 A | 5/2012 |
| KR | 1012309480000 B1 | 2/2013 |
| KR | 1012489040000 B1 | 2/2013 |
| WO | 2009017035 A1 | 5/2009 |

* cited by examiner

*Primary Examiner* — Anthony Ho
*Assistant Examiner* — Kevin Quinto
(74) *Attorney, Agent, or Firm* — Cantor Colburn LLP

(57) ABSTRACT

An organic electroluminescence device includes a support substrate, a first transparent electrode on the support substrate, an organic light-emitting layer on the first transparent electrode, a second transparent electrode on the organic light-emitting layer, and a high refractive index layer arranged between the support substrate and the first transparent electrode, having at least one layer having a refractive index greater than or equal to a refractive index of the support substrate, having a light dispersion portion for dispersing incident light from the organic light-emitting layer, and having a planar surface contacting the first transparent electrode.

17 Claims, 13 Drawing Sheets

ORGANIC ELECTROLUMINESCENCE DEVICE AND METHOD OF MANUFACTURING THE SAME

CROSS-REFERENCE TO RELATED APPLICATIONS

This application claims the benefit of Japanese Patent Application No. 2012-227483, filed on Oct. 12, 2012, in the Japanese Intellectual Property Office and Korean Patent Application No. 10-2013-0112864, filed on Sep. 23, 2013, in the Korean Intellectual Property Office, the disclosure of which is incorporated herein in its entirety by reference.

BACKGROUND

1. Field

The present disclosure relates to an organic electroluminescence device (OLED) and a method of manufacturing the same.

2. Description of the Related Art

With the active developments of flat panel displays, an organic electroluminescence device (OLED) is a typical one of surface light-emitting devices that are used for the flat panel displays. The OLED is a light emitting device using electroluminescence of a solid fluorescent material. Since the OLED has a stack layer of materials having different refractive indices, a radiation efficiency of light to the outside (light extraction efficiency) is low due to the reflection at an interface between layers.

In brief calculation of light extraction efficiency, a waveguide light that is confined in a transparent electrode or an organic light-emitting layer so as not to be extractable is about 45% and a substrate waveguide light that is confined in a substrate so as not to be extractable is about 35%. In other words, only about 20% of the light that is emitted may be extracted to the outside.

Accordingly, many solutions have been suggested to improve the light extraction efficiency by providing a means for converting an exit angle of light on a substrate of an OLED. For example, a diffractive lattice structure is manufactured on a substrate so that reflection of light of a particular wavelength is prevented so as to improve extraction efficiency. A lens structure is provided on a substrate surface so that extraction efficiency may be improved. However, since a fine structure is needed in the method, there is a difficulty in a manufacturing process.

SUMMARY

Provided is an organic electroluminescence device (OLED) which may improve light extraction efficiency and yield.

Provided is a method of manufacturing an organic electroluminescence device (OLED) which may improve light extraction efficiency and yield.

Additional aspects will be set forth in part in the description which follows and, in part, will be apparent from the description, or may be learned by practice of the presented embodiments.

According to an aspect of the present inventive concept, an organic electroluminescence device includes a support substrate, a first transparent electrode on the support substrate, an organic light-emitting layer on the first transparent electrode, a second transparent electrode on the organic light-emitting layer, and a high refractive index layer arranged between the support substrate and the first transparent electrode, having at least one layer having a refractive index greater than or equal to a refractive index of the support substrate, having a light dispersion portion for dispersing incident light from the organic light-emitting layer, and having a planar surface contacting the first transparent electrode.

The organic electroluminescence device may further include a reflection mirror layer that is provided at a side opposite to a surface where light from the organic light-emitting layer is extracted.

A diameter of an air bubble existing in the high refractive index layer may be less than or equal to $1/10$ of a thickness of a layer adjacent to the first transparent electrode among layers forming the high refractive index layer.

A rate in a size of a horizontal section of the air bubble with respect to an entire area of a horizontal section of the high refractive index layer may be less than or equal to 0.5%. A rate in a size of a vertical section of the air bubble with respect to an entire area of a vertical section of the high refractive index layer may be less than or equal to 0.5%.

The organic electroluminescence device may further include a protection layer between the organic light-emitting layer and the second transparent electrode.

Each of the first transparent electrode and the second transparent electrode may be formed of a metal oxide.

Each of the first transparent electrode and the second transparent electrode may have a thickness of greater than or equal to about 30 nm.

The organic electroluminescence device may further include a light transmissive charging layer that is provided between the second transparent electrode and the reflection mirror layer.

The light transmissive charging layer may be formed of $SiOx$, $SiNx$, $MoOx$, $TiOx$, $TiOx$, or $WOx$.

The reflection mirror layer may include a dielectric multi-layer film.

The support substrate may include an embossed surface.

The high refractive index layer may have a thickness of greater than or equal to about 30 times and less than or equal to about 40 times of an average surface roughness Ra of the embossed surface.

The average surface roughness Ra of the embossed surface may be greater than or equal to about 0.7 μm and less than or equal to about 5 μm.

The high refractive index layer may have a thickness of greater than or equal to about 1.3 times of a maximum surface roughness Rz of the embossed surface.

A thickness of the high refractive index layer may be greater than or equal to about 3 μm and less than or equal to about 100 μm.

According to another aspect of the present inventive concept, a backlight includes the organic electroluminescence device according to the organic electroluminescence device.

According to another aspect of the present inventive concept, an illumination apparatus includes the organic electroluminescence device according to the organic electroluminescence device.

According to another aspect of the present inventive concept, a display includes the organic electroluminescence device according to the organic electroluminescence device.

According to another aspect of the present inventive concept, a method of manufacturing an organic electroluminescence device includes forming a high refractive index layer on a support substrate, planarizing a surface of the high refractive index layer by using a glass paste composition including glass frit having a refractive index of greater than or equal to a refractive index of the support substrate, forming a first transparent electrode on the high refractive index layer, forming an organic light-emitting layer on the first transparent electrode, and forming a second transparent electrode on the organic light-emitting layer.

The method may further include a reflection mirror layer at a side opposite to a surface where light is extracted from the organic light-emitting layer.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
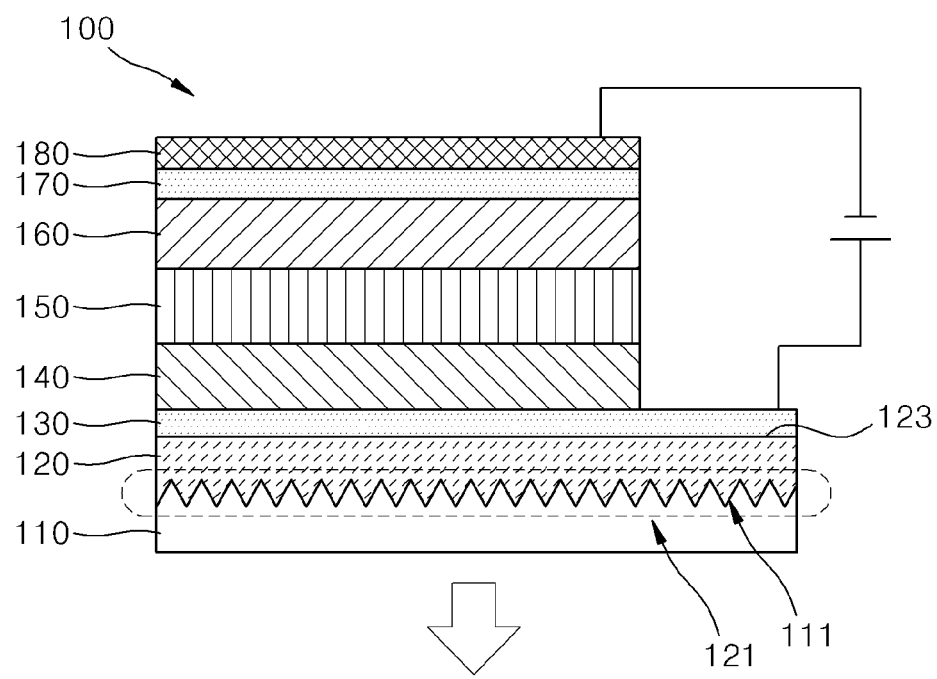
FIG. 1 is a cross-sectional view of an organic electroluminescence device (OLED) according to an embodiment of the present invention.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

Expressions such as "at least one of," when preceding a list of elements, modify the entire list of elements and do not modify the individual elements of the list.

FIG. 1 is a cross-sectional view of an organic electroluminescence device (OLED) 100 according to an embodiment of the present invention. The OLED 100 according to the present embodiment includes a support substrate 110, a first transparent electrode 130, a hole transport layer 140, an organic light-emitting layer 150, an electron transport layer 160, and a second transparent electrode 170.

The first transparent electrode 130 may be used, for example, as an anode. The second transparent electrode 170 may be used, for example, as a cathode. A high refractive index layer 120 may be provided between the support substrate 110 and the first transparent electrode 130. A reflection mirror layer 180 may be provided on the second transparent electrode 170. The OLED 100 is of a bottom emission type and thus light may be emitted downwardly from the support substrate 110.

An embossed surface 111 may be formed on a surface of the support substrate 110. The high refractive index layer 120 is provided on the support substrate 110 and a surface of the high refractive index layer 120 contacting the first transparent electrode 130 may be planar. The high refractive index layer 120 may include a light scattering portion 121 for scattering light input from the first transparent electrode 130 and a planar surface 123 contacting the first transparent electrode 130. The light scattering portion 121 may be an area around an interface between the support substrate 110 and the high refractive index layer 120 where the embossed surface 111 exists in an area surrounded by a dashed line of FIG. 1. The light scattering portion 121 may be a one-layer structure, but not limited thereto.

The support substrate 110 may be formed of a transparent material, for example, glass such as soda-lime glass, non-alkali glass, high strain point glass (PD200, etc.), or transparent plastic. The support substrate 110 may have the embossed surface 111 on a surface thereof. For example, insulating organic matter may be used as the transparent plastic for forming the support substrate 110. For example, the transparent plastic may include polyether sulfone (PES), polyacrylate (PAR), polyetherimide (PEI), polyethylene naphthalate (PEN), polyethylene terephthalate (PET), polyphenylene sulfide (PPS), polyalylate, polyimide, polycarbonate (PC), cellulose triacetate (TAC), cellulose acetate propionate (CAP), etc. The embossed surface 111 may have a random embossed pattern for disturbing a refraction angle of incident light when light generated by the organic light-emitting layer 150 is incident on the support substrate 110 after passing through the first transparent electrode 130.

The high refractive index layer 120 may be formed of a planarization material on the embossed surface 111. The planarization material may be a paste material formed of glass frit. When the high refractive index layer 120 is formed, solution of glass frit by burning is needed. A burning process is performed at a temperature of about 500° C. and thus the support substrate 110 may be formed of a glass material having a melting point higher than that of a plastic material having a low melting point.

A degree of embossment of the embossed surface 111 may be a roughness of greater than or to about 0.7 μm and less than or equal to about 5 μm as an average surface roughness (Ra) defined in JIS B 0601-200, but not limited thereto. When Ra is smaller than 0.7 μm, light extraction effect may be insufficient. Also, when Ra is beyond 5 μm, light extraction efficiency may be degraded. The light extraction efficiency may be increased by using scattering by the embossed surface 111. In this case, light repeats reflection whenever passing through the light scattering portion 121 within the OLED 100 and thus light may be extracted to the outside of the OLED 100. When the Ra of the embossed surface 111 is high, the high refractive index layer 120 may be formed thick for planarization of the support substrate 110. However, when the high refractive index layer 120 having a high refractive index is too thick, loss of light may occur due to light absorption in the high refractive index layer 120. Considering the above, glass frit used as a material of the high refractive index layer 120 may include a metal oxide. Since an absorption coefficient "k" in a visible range of the metal oxide is very small, attenuation of light due to a small number of reflections or scattering is small. Thus, when glass frit used as a material of the high refractive index layer 120 includes a metal oxide, loss of light due to light absorption in the high refractive index layer 120 may be reduced.

When a substrate having a high surface roughness is used for a display device, large light scattering may scatter and blur light to the outside of a screen so that image quality may be degraded. However, a certain degree of surface roughness is needed in increase the light extraction efficiency. Accordingly, when the support substrate 110 is used for a display use, correlation of light scattering and light extraction efficiency according to the surface roughness of the support substrate 110 is taken into consideration. For example, as embossment of a surface of the support substrate 110, that is, a set value of Ra, is optimized according to a display use and a use for illumination apparatuses or backlights, it is possible to satisfy the respective specifications and extract light to the front side.

For example, when the support substrate 110 is used for an illumination use, the support substrate 110 may have the embossed surface 111 having a relatively high Ra. Also, the average surface roughness Ra or a maximum roughness Rz, which will be described later, of the support substrate 110 may be easily measured by using a contact type surface roughness tester or a non-contact type optical surface roughness tester.

Since the light incident on the embossed surface 111 is scattered, a ratio of light transmitting the support substrate 110 without a change in directions to light traveling perpendicular to the support substrate 110 decreases. Such a state may be presented by a haze value "Haze" of a substrate. The Haze is a value (percentage) expressed in figures of a ratio of non-perpendicular transmission light component to transmitted light of the incident light perpendicular to the support substrate 110. When there is a demand to increase external visibility such as a glass window, a member having a high Haze may not be used. However, in order to increase light extraction efficiency such as a light emitting device substrate according to the present embodiment, a member having a high Haze is used to increase a scattering component that is a non-perpendicular transmitted light component. For example, the support substrate 110 may have a Haze of over 30%, 50%, or 70%. The Haze may be easily measured by using an integrating sphere attached transmission rate measurement system or a Haze meter.

The high refractive index layer 120 may be arranged between the support substrate 110 and the first transparent electrode 130 and may have a refractive index over the refractive index of the support substrate 110.

As described above, when the support substrate 110 is used for a surface light-emitting device such as an OLED, the support substrate 110 has a high levelness. Accordingly, the high refractive index layer 120 may be provided to planarize the embossed surface 111 formed on the support substrate 110. The high refractive index layer 120 may be formed of a glass paste composition including glass frit. The high refractive index layer 120 having the planar surface 123 at a side adjacent to the first transparent electrode 130 may provided a planar surface to the support substrate 110.

When the high refractive index layer 120 is formed using glass frit, glass paste is coated on the support substrate 110. The glass paste may be formed by mixing glass frit with a high boiling point solvent such as terpineol or butyl carbitol acetate and viscous binder resin such as ethyl cellulose or acryl resin. The embossed surface 111 may be planarized by drying and burning the glass paste. Also, the high refractive index layer 120 having a sufficient thickness for planarization may be formed. The glass paste composition is a composition of a paste shape including glass frit, solvent, and resin. Each component of the glass paste composition will be described below.

<Glass Frit>

The glass frit has a thermal characteristic of forming a transparent glass layer (the high refractive index layer 120, later) at a temperature at which distortion or twist of the support substrate 110 does not occur. A general glass substrate, for example, soda-lime glass, used as the support substrate 110 may be distorted or twisted when heated at a temperature of about 500° C. or high so that a warpage may occur in the support substrate 110. To form the high refractive index layer 120 at a temperature of about 500° C. or low, a glass transition temperature Tg is about 450° C. or low, for example, about 400° C. or low.

Also, when a coefficient of linear expansion of glass frit is different from that of a material for the support substrate 110, stress remains in the support substrate 110 when the high refractive index layer 120 is formed so that cracks may occur. Accordingly, the glass frit in the present embodiment may have a coefficient of linear expansion substantially the same as that of a material for 110, for example, soda-lime glass or non-alkali glass. For example, when the support substrate 110 is formed of soda-lime glass, the coefficient of linear expansion of soda-lime glass is about $85 \times 10^{-7}/C.°$ and thus glass frit may have a coefficient of linear expansion of about $(85\pm10) \times 10^{-7}/°C$.

When a difference in the coefficient of linear expansion between glass frit and the material for the support substrate 110 is greater than about $\pm 10 \times 10^{-7}$, the high refractive index layer 120 that is thin and formed by using glass frit may be damaged or cracked.

The material for forming the high refractive index layer 120, that is, glass frit, may have a refractive index greater than that of the support substrate 110. Also, the refractive index of glass frit may be substantially the same as the first transparent electrode 130 that is formed of, for example, indium tin oxide (ITO).

For example, the refractive index of the support substrate 110 used for a surface light-emitting device as in the OLED is about 1.5 and the refractive index of a transparent conductive film (transparent electrode) is about 2. When the refractive index of the high refractive index layer 120 is the same as that of the support substrate 110, reflection at the interface with the first transparent electrode 130 is made to be the same as a case where the embossed surface 111 and the high refractive index layer 120 do not exist so that improvement of light extraction efficiency may not be anticipated. Alternatively, a refractive index nd1 of glass frit for forming the high refractive index layer 120, where "d1" denotes a D line of sodium and is about 589 nm, and a refractive index nd2 of the first transparent electrode 130, for example, ITO, may not satisfy an inequality that nd1/nd2≥0.9, which will be described below.

Figure 2:
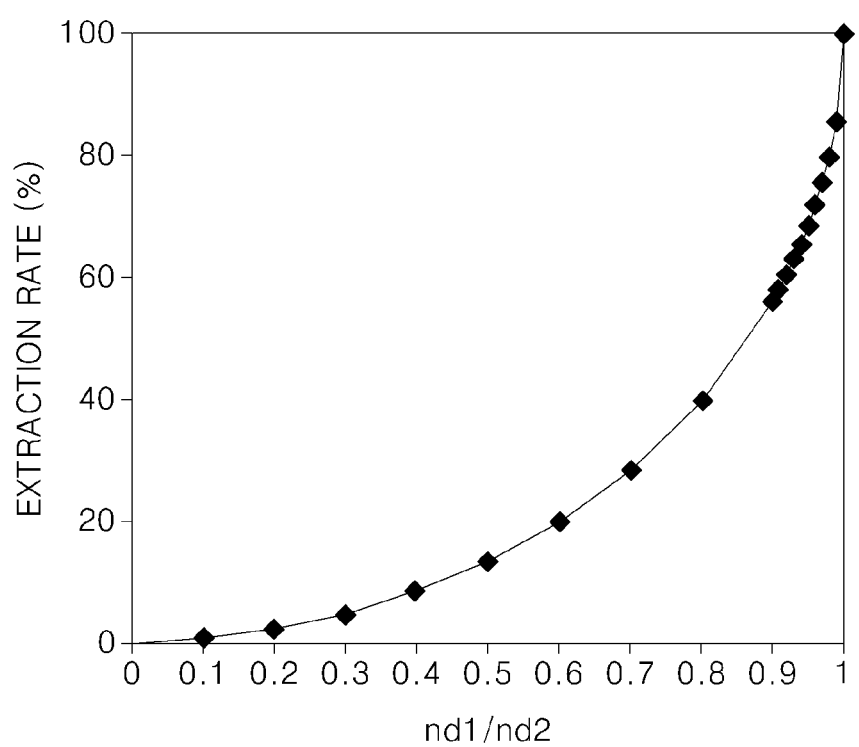
FIG. 2 is a graph showing a result of calculation at a single interface how much light may be extracted by converting into a solid angle, assuming that all light over a critical angle may be extracted.

A critical angle θ according to the Snell's law exist at an interface between media having different refractive indices n1 and n2 and the critical angle θ is expressed by θ=Arcsin (n2/n1). For example, the critical angle between general glass, for example, having nd=1.5, and ITO, for example, having nd=2.0, is 48.6° obtained from the above-described equation. The incident light at an angle that is smaller than or equal to the critical angle may not be extracted as light that propagates through the ITO or the organic light-emitting layer to be output. FIG. 2 is a graph showing a result of calculation at a single interface how much light may be extracted by converting into a solid angle, assuming that all light over a critical angle may be extracted. An extraction rate indicated on a vertical axis of FIG. 2 denotes a percentage of a value $(1-\cos\theta)$ obtained by dividing a solid angle (steradian or "sr") of the incident angle $\theta$, that is, $2\pi(1-\cos\theta)$, by a solid angle ($2\pi$) of a hemisphere corresponding to solid angles when all light is extracted.

As illustrated in FIG. 2, when $nd1/nd2 \geq 0.9$, the total reflection at an interface is sufficiently decreased and the total reflection at the interface between the transparent electrode and the substrate decreases. Also, to almost remove influence of the total reflection, it is possible that $nd1/nd2 \geq 1$. For example, when the first transparent electrode 130 formed of ITO having a refractive index nd2 of 2.0 is used, the refractive index nd1 of the high refractive index layer 120 according to the present embodiment may be 1.8 or high. Alternatively, the refractive index nd1 of the high refractive index layer 120 may be over 2.

As described above, as a component of glass frit having a low glass transition temperature or a high refractive index, high refractive index glass may be used which contains one or two components selected from $P_2O_5$, $SiO_2$, $B_2O_3$, $Ge_2O$, and $TeO_2$ as a network former and contains one or two components selected from $TiO_2$, $Nb_2O_5$, $WO_3$, $Bi_2O_3$, $La_2O_3$, $Gd_2O_3$, $Y_2O_3$, $ZrO_2$, $ZnO$, $BaO$, $PbO$, and $Sb_2O_3$. Also, as a component of glass frit according to the present embodiment, to control the properties of glass other than the above components, alkali metal oxide, alkali earth metal oxide, and fluoride may be used within a range of not damaging the properties required for a refractive index. As a component system of glass frit, for example, a $B_2O_3$—$ZnO$—$La_2O_3$ system, a $P_2O_5$—$B_2O_3$—$R'_2O$—$R''O$—$TiO_2$—$Nb_2O_5$—$WO_3$—$Bi_2O_3$ system, a $TeO_2$—$ZnO$ system, a $B_2O_3$—$Bi_2O_3$ system, a $SiO_2$—$Bi_2O_3$ system, a $SiO_2$—$ZnO$ system, a $B_2O_3$—$ZnO$ system, and a $P_2O_5$—$ZnO$ system may be used. R' denotes an alkaline metal element and R" denotes an alkaline earth metal element. The above-listed component list is a simple example and, if it is a component system satisfying the conditions such as the above-described glass transition temperature or refractive index, the present invention is not limited to the above example. As described above, the glass frit material is not limited to the above materials only if it has a high refractive index and a low melting point, for example, 450° C. or low, and lead-free glass may be used as the glass frit material considering an environment issue. Also, as a high refractive index component, among $TiO_2$, $Nb_2O_5$, $WO_3$, $Bi_2O_3$, $La_2O_3$, $Gd_2O_3$, $Y_2O_3$, $ZrO_2$, $ZnO$, $BaO$, $PbO$, and $Sb_2O_3$, $Bi_2O_3$ may be used as an example of forming the high refractive index layer 120 at a low melting point on the support substrate 110 having a relatively low heat resistant characteristic such as soda-lime glass. As a glass component including $Bi_2O_3$, for example, a $Bi_2O_3$—$B_2O_3$—$SiO_2$—$ZnO$ system, a $Bi_2O_3$—$B_2O_3$—$SiO_2$ system, a $Bi_2O_3$—$B_2O_3$—$ZnO_2$ system, and a $Bi_2O_3$—$B_2O_3$—$R_2O$—$Al_2O_3$ system, where "R" is an alkali metal, may be used.

<Solvent>

A solvent used for a glass paste composition of the present embodiment is not particularly limited if it is an organic solvent. However, considering a manufacturing process, when a drying speed is too fast, an organic solve is dried during manufacturing and thus separation of a solid matter occurs which is not recommended. From this point of view, a solvent having a boiling point of 150° C. or high, for example, 180° C., may be used as an organic solvent used for the glass paste composition of the present embodiment. Such a solvent may be a terpene-based solvent such as terpineol, etc. or a carbitol-based solvent such as butyl carbitol, butyl acetate carbitol, etc.

<Resin>

Resin used for the glass paste composition according to the present embodiment is not particularly limited only if it has an appropriate viscosity for coating a paste and resin that is lost at a temperature lower than the glass transition temperature of glass frit may be used. When calcination of resin is not removed at a temperature that is lower than a temperature at which glass frit exerts fluidity, the resin is gasified at a temperature at which glass is burned, generating air bubbles in the glass. The resin may include ethyl cellulose or nitrocellulose as cellulose-based resin, acrylic resin or methacrylic resin as acrylic resin, etc.

<Other Additives>

An additive for improving dispersion of glass frit and resin or controlling rheology may be added, as necessary, to the glass paste composition according to the present embodiment. The additive may include, for example, polymer added to control viscosity suitable for a process such as slit coating or to improve dispersion of glass frit, a viscosity agent added to control rheology, or a dispersing agent added to make a glass paste composition having a superior dispersion. For example, acrylic polymer may be used as the polymer. Also, cellulose-based resin such as ethyl cellulose, polyoxyalkylene resin such as polyethylene glycol, etc., for example, may be used as the thickener. Also, polyvalent carboxylic acid or its ammonium salt may be used as the dispersing agent. Polyvalent carboxylic acid may include, for example, lower to higher aliphatic polyvalent carboxylic acid and may form ammonium salt such as tetrabutyl ammonium salt. For example, a HIPLAD series by Kusumoto Chemicals, Ltd. or a Disperbyk series by BYK-Chemie may be used as the dispersing agent. The content of the additive may be, for example, less than or equal to 3 weight parts to 100 weight parts of the glass paste composition.

An SOG material or CVD film, for example, may be used as a material for planarizing an embossed surface of the support substrate 110. When an SOG material is in use, the high refractive index layer 120 may have a thickness in a rage of about 1-2 μm. For example, when the high refractive index layer 120 is formed of SiN by using a CVD method, the high refractive index layer 120 may have a thickness of several micrometers (μm). A structure (embossment) to adjust a refractive angle of incident light on the support substrate 110, for example, dispersion or focusing of light, may be a structure (embossed surface having roughness larger than the wavelength of incident light) that is larger than the wavelength of the incident light. When the SOG material or the CVD film is in use, it is difficult to achieve planarization of an embossed surface.

The thickness of the high refractive index layer 120 is not particularly limited only when it is sufficient to planarize the embossed surface 111 of the support substrate 110. For example, the high refractive index layer 120 may have a thickness of less than or equal to 30 to 40 times of average roughness Ra of the support substrate 110. For example, the high refractive index layer 120 may have a thickness in a range of about 3 μm to about 100 μm. This is because the maximum height Rz of the embossed surface 111 formed by sandblast or wet etching is 10 to 20 times of Ra.

Also, the thickness of the high refractive index layer 120 may be greater than or equal to 1.3 times of the Rz of the embossed surface 111 of the support substrate 110, which is set forth in JIS B 0601-2001. Within 1.3 times of Rz, the high refractive index layer 120 having sufficiently reliability with respect to the above-described driving stability may not be obtained.

It is difficult to form an overcoat having the above thickness in the SOG material (sol-gel material) or a vacuum process (CVD). Although a method of obtaining an overcoat that is a thick film using an organic material such as polymer may be taken into consideration, it is difficult to secure heat resistance (over 300° C.) sufficient for forming a transparent conductive film (transparent electrode) such as ITO. Also, as described above, a high refractive index, for example, greater than or equal to about 2, is needed for the high refractive index layer 120. However, there is no organic material having such a refractive index. In other words, it is difficult to form the high refractive index layer 120 having the above thickness without using the glass paste composition including glass frit according to the present embodiment.

The thickness of the high refractive index layer 120 may be checked by measuring the thickness of a film after burning. However, since the support substrate 110 has the embossed surface 111 (embossed structure), the thickness may vary according to the position of measurement. Accordingly, in the present embodiment, the height from the bottom portion of the embossed surface 111 to the top portion of the high refractive index layer 120 is considered as the thickness of the high refractive index layer 120. When the embossed surface 111 has a random embossed shape, it is often difficult to determine the bottom portion even through analysis of a sectional shape. Accordingly, in this case, the thickness of a film is measured for 10 portions or more that are freely selected and the maximum thickness among them may be determined to be the thickness.

When the embossed surface 111 is planarized, there is a demand for filling the above-described glass frit in a portion corresponding to a valley of the embossed surface 111 without a gap. The structure of the support substrate 110 or the high refractive index layer 120 may be easily checked by observing a section shape thereof by using a scanning electron microscope (SEM).

<Levelness of Interface Between the High Refractive Index Layer 120 and the First Transparent Electrode 130>

When the high refractive index layer 120 is manufactured, the glass paste composition is burned in vacuum or under pressure and thus generation of air bubbles in the high refractive index layer 120 after burning may be restricted. The burning in vacuum or under pressure may reduce the number of air bubbles existing in the high refractive index layer 120 or decrease the size of an air bubble. By restricting the generation of air bubbles in the high refractive index layer 120, levelness of a surface of the high refractive index layer 120 contacting the first transparent electrode 130, that is, an interface between the high refractive index layer 120 and the first transparent electrode 130, may be improved. As the levelness at the interface between the high refractive index layer 120 and the first transparent electrode 130 improves, manufacturing yield of the OLED 100 is improved. Also, as current leakage is restricted, the life and reliability of the OLED 100 may be improved. The interface between the high refractive index layer 120 and the first transparent electrode 130 in the present embodiment may have a levelness of less than or equal to 30 nm with respect to the Ra of the surface of the high refractive index layer 120 contacting the first transparent electrode 130. For example, the interface between the high refractive index layer 120 and the first transparent electrode 130 may have a levelness of less than or equal to 1 nm.

The above-described Haze value is used as one of indices indicating a degree of restriction of generation of air bubbles in the high refractive index layer 120. The Haze value of the high refractive index layer 120 contacting the first transparent electrode 130 in a light-emitting device substrate for the OLED 100 is less than or equal to 5%. When the Haze value of the high refractive index layer 120 is over 5%, the number of air bubbles in the high refractive index layer 120 increases and the size of an air bubble increases and thus it is difficult to secure a sufficient levelness of the interface between the high refractive index layer 120 and the first transparent electrode 130.

The Haze value of the high refractive index layer 120 may be measured by an integrating sphere attached transmission rate measurement system or a Haze meter which are being sold in the market. A Haze value of the high refractive index layer 120 only, not a value of the entire light-emitting device substrate of the OLED 100, is used as the Haze value of the high refractive index layer 120.

A direct index may be used rather than using the diameter of an air bubble and a rate of air bubbles occupying the high refractive index layer 120, as an index of a degree of restriction of generation of air bubbles in the high refractive index layer 120. In this case, the diameter of an air bubble existing in the high refractive index layer 120 may be less than or equal to $\frac{1}{10}$ of the thickness of the high refractive index layer 120 contacting the first transparent electrode 130, for example, $\frac{1}{100}$. Also, the diameter of an air bubble may be less than or equal to 5 μm, for example, less than or equal to 0.5 μm. For example, the diameter of an air bubble may be less than or equal to $\frac{1}{10}$ of the thickness of a layer adjacent to the first transparent electrode 130 of the layers forming the high refractive index layer 120.

The diameter of an air bubble existing in the high refractive index layer 120 may be a diameter of a circle assuming that the air bubble is a circular ball and also may be an average of diameters of all air bubbles included in a field of vision when the high refractive index layer 120 is observed by using an optical microscope. The thickness of the high refractive index layer 120 is already described above.

Regarding the rate of the air bubbles occupying the high refractive index layer 120 contacting the first transparent electrode 130, a rate in the size of a horizontal section of an air bubble with respect to an entire area of a horizontal section of the high refractive index layer 120 may be less than or equal to 0.5%. Also, a rate in the size of a vertical section of an air bubble with respect to the entire area of the vertical section of the high refractive index layer 120 may be less than or equal to 0.5%. For example, the rate in the size of a horizontal section of an air bubble with respect to an entire area of a horizontal section of the high refractive index layer 120 may be less than or equal to 01% and the rate in the size of a vertical section of an air bubble with respect to the entire area of the vertical section of the high refractive index layer 120 may be less than or equal to 0.1%.

The size of a horizontal or vertical section of an air bubble refers to a size of a horizontal or vertical section assuming that the air bubble is a ball.

When the diameter of an air bubble existing in the high refractive index layer 120 and the rate of air bubbles occupying the high refractive index layer 120 exceed the above ranges, the air bubbles in the high refractive index layer 120 may be likely to protrude toward the first transparent electrode 130 from the surface of the high refractive index layer 120. Also, it may be difficult to secure a sufficient levelness of the interface between the high refractive index layer 120 and the first transparent electrode 130.

When the diameter of an air bubble existing in the high refractive index layer 120 and the rate of air bubbles occupying the high refractive index layer 120 are within the above ranges, the levelness of the interface between the high refractive index layer 120 and the first transparent electrode 130 may be improved.

<Shape of Embossment of the Embossed Surface 111>

Figure 5:
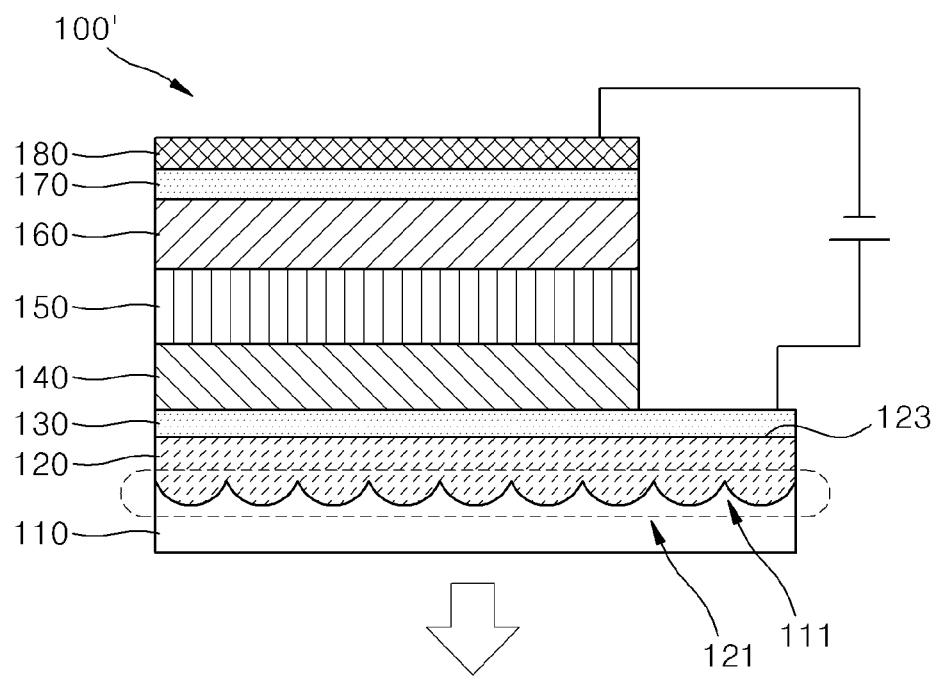
FIG. 5 illustrates a modified example of the OLED of FIG. 1.

The embossed shape of the embossed surface 111 may be the above-described random shape or a regular shape having a uniform structural unit such as a lens shape or a pyramid shape. FIG. 5 is a cross-sectional view of an OLED 100' according to a modified example of the present embodiment.

As illustrated in FIG. 5, in the OLED 100', the embossed surface 111 formed on the surface of the support substrate 110 has a uniform structural unit such as a lens shape or a pyramid shape, not a random shape. When the OLED 100' is applied for a display use, the embossed surface 111 may have a lens structure or a pyramid structure as illustrated in the embossed surface 111 of FIG. 5, not an irregular structure disturbing a refraction angle. Since the embossed surface 111 has a random structure in the OLED 100, the lights generated in the respective organic light-emitting layers are mixed together and thus color bur may occur. In contrast, since the embossed surface 111 of the OLED 100' has a shape of a uniform structure, the lights generated from the organic light-emitting layer 150 may be focused. Accordingly, in the OLED 100', color bur does not occur and the light extraction efficiency may be efficiently improved. There is no particular limit in the shape or size of such a lens structure or pyramid structure only if the structural unit of the lens structure or pyramid structure has a size large enough to the wavelength range of generated light and enough to exert a focusing effect and simultaneously smaller than the size of a pixel. For example, since the size of a pixel of a display is about 100-600 μm and the size of each sub-pixel of RGB is ⅓ of the pixel, the size of the structural unit may be about 30-200 μm. Accordingly, the embossed surface 111 may have a lens shape (roughly hemispheric shape) or a pyramid shape (roughly quadrangular pyramid shape) having a structural unit of, for example, several micrometers to tens of micrometers (height of embossment)

Although FIG. 5 illustrates an example in which the shape of the embossed surface 111 is a lens structure, a pyramid structure may have the same conditions as the lens structure except for the shape of each structural unit.

Also, although the thickness of the high refractive index layer 120 is not particularly limited only if the thickness is sufficient for planarization of the embossed surface 111 of the support substrate 110, the thickness of the high refractive index layer 120 may have a thickness that is, for example, greater than or equal to 1.3 times of the maximum height of the embossed surface 111 of the support substrate 110. In other words, when the embossed surface 111 has a lens structure and the structural unit of the lens has a hemispherical shape having a diameter of about 10 μm, the maximum height of the embossed surface 111 of the support substrate 110 is 5 μm and thus the high refractive index layer 120 may have a thickness of greater than or equal to about 6.5 μm. If the structural unit of a lens has a hemispherical shape having a diameter of about 80 μm, the high refractive index layer 120 may have a thickness of greater than or equal to about 52 μm.

Since the other structures of the OLED 100' are the same as those of the OLED 100, detailed descriptions thereof will be omitted herein.

(First Transparent Electrode 130 and Second Transparent Electrode 170)

The first transparent electrode 130 is a layer functioning as an anode of the OLED 100 and may have conductivity and simultaneously be formed of a transparent material to extract light to the outside of the OLED 100. The second transparent electrode 170 is a layer functioning as a cathode and may be formed of a transparent material to extract light to the outside of the OLED 100 by transmitting reflection light from the reflection mirror layer 180. For example, the transparent electrodes 130 and 170 may be formed of a transparent oxide semiconductor, for example, ITO, indium zinc oxide (IZO), ZnO, or $In_2O_3$.

(Organic Light-emitting Layer 150)

The organic light-emitting layer 150 may include at least one light-emitting layer. The organic light-emitting layer 150 may include a hole injection layer and an electron injection layer. Also, when the organic light-emitting layer 150 includes both of the hole transport layer 140 and the hole injection layer, the hole injection layer may be arranged closer to the first transparent electrode 130 than the hole transport layer 140. Also, the organic light-emitting layer 150 may be arranged far from the first transparent electrode 130 than the hole transport layer 140.

A well-known material such as α-NPD (NPB), TPD, TACP, or triphenyl tetramer may be used as a hole transport material for forming the hole transport layer 140. Also, a well-known material such as polyaniline, polypyrrole, copper phthalocyanine (CuPc), or PEDOT:PSS may be used as a hole injection material for forming the hole injection layer.

The organic light-emitting layer 150 may include one or two layers of a red light-emitting layer, a green light-emitting layer, and a blue light-emitting layer.

Tetraphenylnaphthacene (Rubrene), tris (1-phenyl-isoquinoline)iridium (III) (Ir(piq)3), bis(2-benzo[b]thiophene-2-yl-pyridine)(acetylacetonate)iridium (III)(Ir(btp)2(acac)), tris (dibenzoylmethane)phenanthroline europium (III) (Eu (dbm)3(phen)), tris[4,4'-di-tert-butyl-(2,2')-bipyridine]ruthenium (III) complex (Ru(dtb-bpy)3*2(PF6)), DCM1, DCM2, Eu (thenoyltrifluoro acetone)3(Eu(TTA)3), butyl-6-(1,1,7,7-tetramethyljulolidyl-9-enil)-4H-pyran) (DCJTB), etc. may be used as a material for forming a red light-emitting layer. In addition, a polymer light-emitting material such as polyfluorene-based polymer or polyvinyl-based polymer may be used therefor.

Also, $Alq_3$, 3-(2-benzothiazolyl)-7-(diethylamino)coumarin(Coumarin6), 2,3,6,7-tetrahydro-1,1,7,7,-tetramethyl-1H, 5H, 11H-10-(2-benzothiazolyl) quinolizine-[9,9a,1gh] coumarin (C545T), N,N'-dimethyl-quinacridone(DMQA), tris(2-phenylpyridine)iridium(III)(Ir(ppy)3), etc. may be used as a material for forming a green light-emitting layer. In addition, a polymer light-emitting material such as polyfluorene-based polymer or polyvinyl-based polymer may be used therefor.

Oxadiazole dimer dyes (Bis-DAPOXP), spiro compounds (Spiro-DPVBi, Spiro-6P), triaryl amine compounds, bis (styryl)amine(DPVBi, DSA), 4,4'-bis(9-ethyl-3-carbazo-vinylene)-1,1'-biphenyl(BCzVBi), phenylene, 2,5,8,11-tetra-tert-butyl phenylene(TPBe), 9H-carbazole-3,3'-(1,4-phenylene-di-2,1-ethenediyl)bis[9-ethyl-(9C)](BCzVB), 4,4-bis[4-(di-p-tryl amino)styryl]biphenyl(DPAVBi), 4-(di-p-tryl amino)-4'-[(di-p-tryl amino)styryl] stilbene(DPAVB), 4,4'-bis[4-(diphenyl amino)styryl]biphenyl(BDAVBi), bis(3, 5-difluoro-2-(2-pyridyl)phenyl-(2-carboxy pyridyl)iridium III(FIrPic), etc. may be used as a material for forming a blue light-emitting layer. In addition, a polymer light-emitting material such as polyfluorene-based polymer or polyvinyl-based polymer may be used therefor.

An electron injection layer may be further provided between the hole transport layer 140 and the electron transport layer 160. Alternatively, the electron injection layer may be provided between the electron transport layer 160 and the second transparent electrode 170. A well-known material such as oxazol derivatives (PBD, OXO-7), triazole derivatives, boron derivatives, xyrol derivatives, Alq$_3$, etc. may be used as an electron transport material for forming the electron transport layer 160. Also, a well-known material such as LiF, Li$_2$O, CaO, CsO, CsF$_2$, etc. may be used as an electron injection material.

(Reflection Mirror Layer 180)

The reflection mirror layer 180 may be formed of a metal material or in a dielectric multilayer film. For example, among monoelement thin film metal of any one of Ag, Pt, Pd, Au, Ni, Ir, and Cr, an oxide compound of Ag, Mg, Al, Pt, Pd, Au, Ni, Nd, Ir, Cr, Li, and Ca, and an alloy, a compound whose properties are stable in air may be used as a material for forming the reflection mirror layer 180.

[Manufacturing Method of OLED 100]

Figure 3:
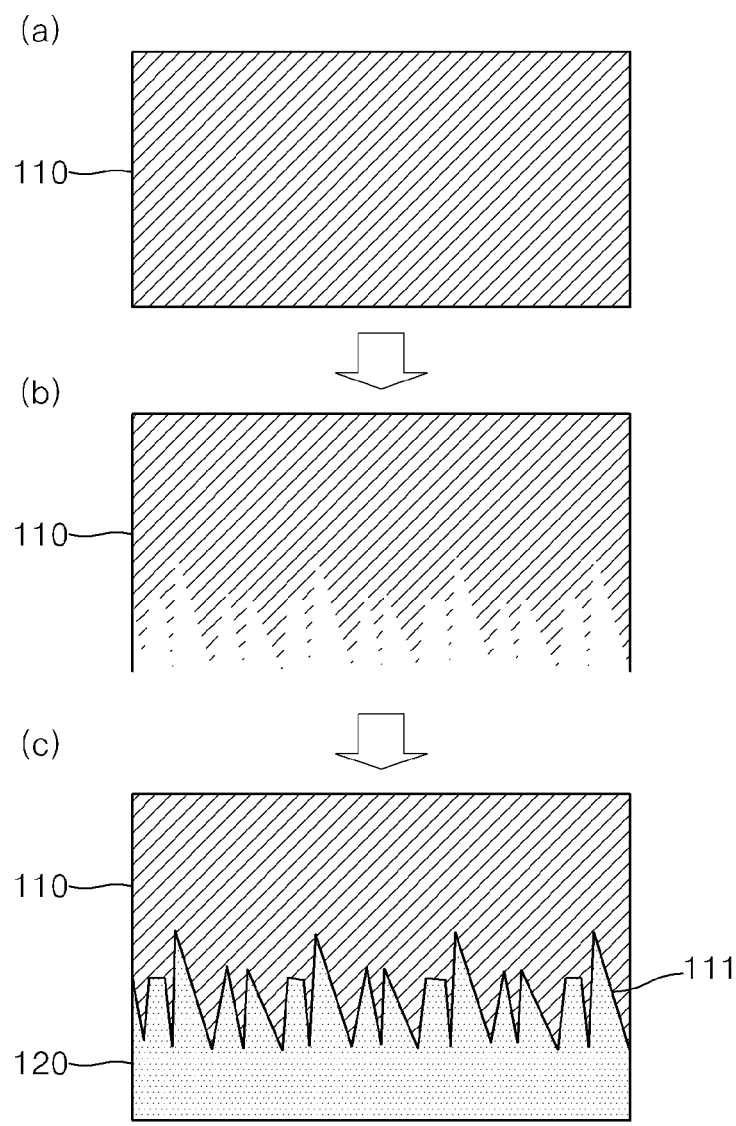
FIG. 3 illustrates a method of manufacturing an OLED according to an embodiment of the present invention.
Figure 4:
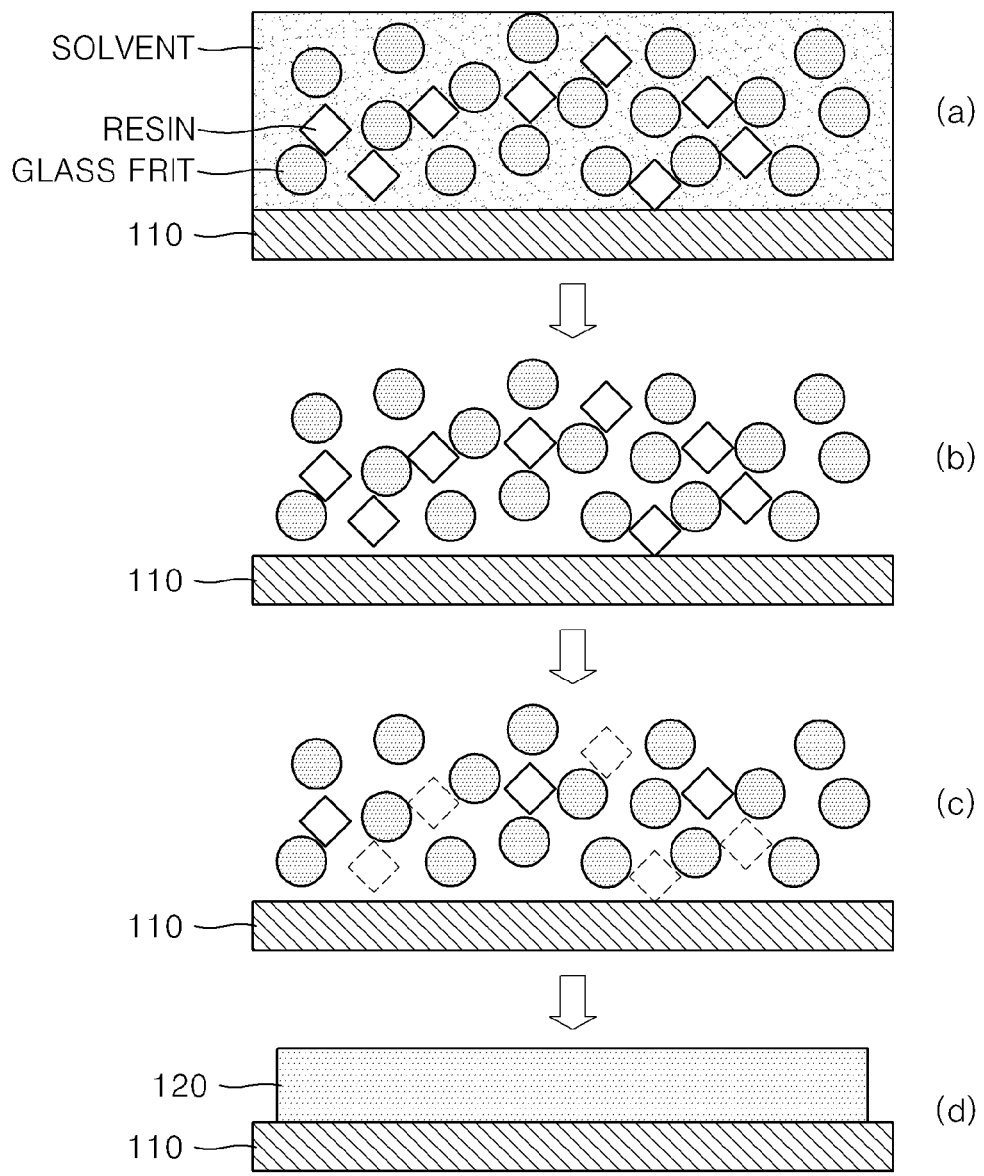
FIG. 4 illustrates an example of a method of forming a high refractive index layer of an OLED according to an embodiment of the present invention.

Referring to FIGS. 3 and 4, the method of manufacturing the OLED 100 according to the present embodiment will be described in detail. FIG. 3 illustrates a method of manufacturing the OLED 100. FIG. 4 illustrates an example of a method of forming the high refractive index layer 120.

The method of manufacturing the OLED 100 includes a surface roughening process, a coating process, a drying process, and a burning process. The surface roughening process is a process of forming the embossed surface 111 on a surface of the support substrate 110. The coating process is a process of coating glass frit having a refractive index over that of the support substrate 110 and a glass paste composition including a solvent and resin on the surface of the support substrate 110 where the embossed surface 111 is formed. The drying process is a process of drying the glass paste composition coated on the support substrate 110 and vaporizing the solvent. The burning process is a process of burning the glass paste composition after the solvent is vaporized in vacuum or under pressure to remove the resin and simultaneously dissolving the glass frit to form the high refractive index layer 120 on the support substrate 110. The method of manufacturing the OLED 100 including the above processes is described below.

(Surface Roughening Process)

As illustrated in FIG. 3 the embossed surface 111 is formed on the surface of the support substrate 110 such as soda-lime glass, non-alkali glass, etc. (see a diagram (a) of FIG. 3) by a sand blast method, a wet etching method (frost method), or a press method (see a diagram (b) of FIG. 3). The embossed surface 111 may be a random embossed surface. Referring to 1, the embossed surface 111 may disturb a refraction angle of incident light when the light generated from the organic light-emitting layer 150 passes through the first transparent electrode 130 and is incident on the support substrate 110. Although a degree of embossment of the embossed surface 111 is not particularly limited, it may have a range between about 0.7 μm to about 5 μm as the average surface roughness Ra.

Alternatively, the embossed surface 111 may have a uniform structural unit as illustrated in FIG. 5. In this case, for example, the embossed surface 111 may be formed to have a uniform structural unit such as a lens structure or a pyramid structure. The lens structure or the pyramid structure may be formed by using, for example, a mold thermal transfer method, a photolithography/wet etching method, laser processing, or grinding using a whetstone.

(Preparing Glass Paste Composition)

A glass paste composition including glass frit, a solvent, and resin is prepared. In a method of manufacturing a glass paste composition, glass frit, resin (binder), and other component are dissolved and mixed in a solvent and mulled by using a roll or a mill, thereby manufacturing a paste in which the glass frit is distributed (see a diagram (a) of FIG. 4). A mixing ratio of glass frit, a solvent, and resin may be, for example, glass frit of about 70~80 mass %, a solvent of about 10~20 mass %, and resin of about 1~2 mass %. The drying process and the burning process that are described later may be performed at a temperature of about 500° C. or low, considering the melting point of the support substrate 110

(Coating Process)

As illustrated in FIG. 4, the prepared glass paste composition is coated on the surface of the embossed surface 111 of the support substrate 110. A coating method of the glass paste composition is not particularly limited herein and a well-known method such as a barcoat method, doctor blade, slit coat, die coat, etc. may be employed (Drying Process)

The support substrate 110 where the glass paste composition is coated on the embossed surface 111 is transferred to a hot wind drier to remove the solvent (see a diagram (b) of FIG. 4). A drying temperature may be less than or equal to about 500° C. so that the support substrate 110 is not dissolved as described above. For example, the drying temperature may be greater than or equal to about 100° C. and less than or equal to about 150° C.

(Burning Process)

After the drying process, the support substrate 110 removed of the solvent is transferred to a burning furnace and burned at a temperature of greater than or equal to a glass transition temperature Tg and less than or equal to a softening temperature Ts of the glass frit, thereby simultaneously removing the binder resin and dissolving the glass frit (see a diagram (c) of FIG. 4). As the support substrate 110 is burned at a temperature of greater than or equal to the softening temperature Ts of the glass frit and less than or equal to about 500° C. in the burning furnace, the high refractive index layer 120 may be formed on the surface of the support substrate 110 (see diagrams (c) and (d) of FIG. 4).

The burning process is performed in vacuum or under pressure. Accordingly, the generation of air bubbles in the high refractive index layer 120 after burning may be prevented. As the generation of air bubbles in the high refractive index layer 120 is restricted, a degree of levelness of the interface between the high refractive index layer 120 and the first transparent electrode 130 increases so that the manufacturing yield of the OLED 100 may be improved and the life and reliability of the OLED 100 may be improved.

The principle of restricting the generation of air bubbles by the burning in vacuum and the burning under pressure is described below. Air bubbles exist in the high refractive index layer 120 for the following reason. As air in the atmosphere is mixed with the glass paste composition, the air exists around the glass frit. Since the air remains after the burning, air bubbles are generate in the high refractive index layer 120. It is very difficult to remove air bubbles generated in the high refractive index layer 120 therefrom after the high refractive index layer 120 is formed by burning the glass paste composition. Accordingly, the generation of air bubbles may be restricted by preventing air from existing around glass frit when the glass frit is dissolved in the burning process. To reduce air around glass frit, the burning process is performed in vacuum or under pressure. To prevent air from existing around glass frit when the glass frit is dissolved, it is important to make a vacuum or pressure state before the glass frit is dissolved.

For the vacuum burning, since the vicinity of glass frit is in vacuum atmosphere during burning, air hardly exists around the glass frit. Accordingly, if the glass paste composition is burned in this state, air bubbles are hardly generated within the high refractive index layer 120 after burning. To effectively restrict the generation of air bubbles, the glass paste composition is burned in vacuum under 0.3 Pa in the burning process.

For the pressure burning, since the glass paste composition is compressed and the glass frit is in a condensed state during burning, air hardly exists around the glass frit. Accordingly, even when the glass paste composition is burned in such a state, air bubbles are hardly generated within the high refractive index layer 120 after burning. To effectively restrict the generation of air bubbles, the glass paste composition may be burned under pressure of 110 kPa or high in the burning process.

As described above, the high refractive index layer 120 may be obtained by coating a paste composition including glass frit and then drying and burning the same, and a desired thickness may be obtained by repeating these processes by multiple times as necessary. When a desired thickness of the high refractive index layer 120 is over about 40-50 µm, the coating and burning processes may be repeated by multiple times. To improve light extraction efficiency, the maximum height of the embossment of the support substrate 110 needs to be increased and thus the thickness of the high refractive index layer 120 is increased to planarize such a large embossment. In forming the large embossment, embossment of the surface of the support substrate 110 may be further planarized by coating and burning the glass paste composition by multiple times.

Next, the first transparent electrode 130 is formed by forming ITO, IZO, ZnO, $In_2O_3$, etc. using a method such as spin coat, sputtering, etc. on the support substrate 110 whose surface is planarized by the high refractive index layer 120. An operation of forming a thin film including a material having a refractive index higher than that of the first transparent electrode 130 may be further provided between the planarization of the surface of the high refractive index layer 120 and the forming of the first transparent electrode 130.

An electron transport layer 160 and the second transparent electrode 170 are formed after forming the hole transport layer 140 and the organic light-emitting layer 150 by depositing a hole transport material or a light-emitting material on the first transparent electrode 130. The reflection mirror layer 180 may be formed by depositing metal such as Ag, Mg, Al, etc. on the second transparent electrode 170 (see FIG. 1).

A method of forming the hole transport layer 140, the organic light-emitting layer 150, the electron transport layer 160, or the reflection mirror layer 180 may be a well-known method such as vacuum deposition, a cast method (spin cast method, dipping method, etc.), an inkjet method, a print method, (letterpress printing, gravure printing, offset printing, screen printing, etc.), etc.

A light-emitting device substrate used for the OLED 100 according to the present embodiment has embossment (surface roughness) of over a wavelength and thus light incident on the device is dispersed so that lights of all wavelengths may be efficiently extracted. Thus, the OLED 100 may be appropriately used for a white OLED and applied for an illumination device or a backlight for a display device which needs a high efficiency.

Figure 6:
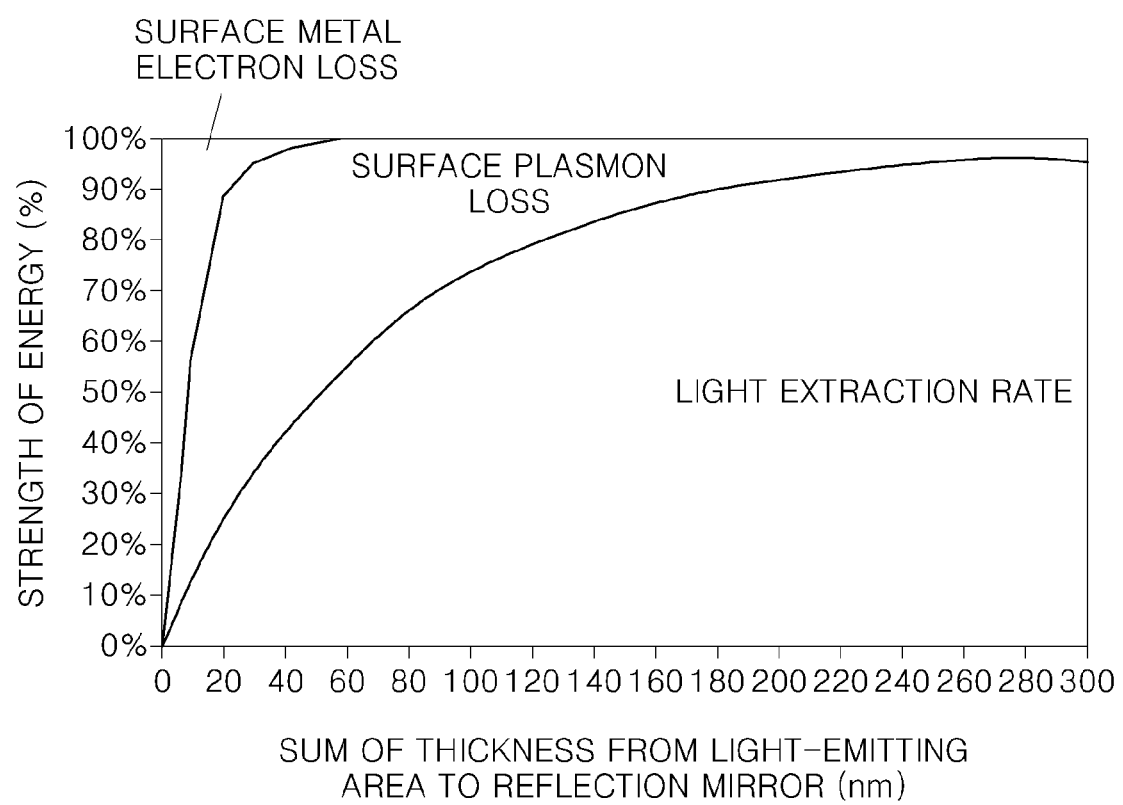
FIG. 6 is a graph showing a change in energy strength according to the sum of thickness from a light emitting area to a reflection mirror.

FIG. 6 is a graph showing energy loss by the OLED 100 according to the present embodiment. According to the stack structure of the OLED 100, only a surface plasmon mode contributes to energy loss.

Figure 7:
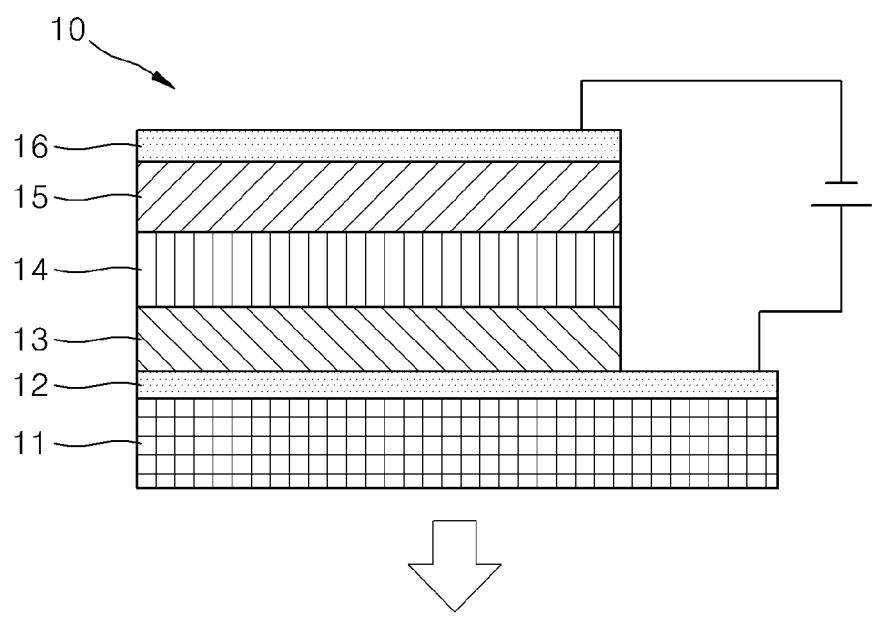
FIG. 7 illustrates a comparative example for comparison with the present embodiment.
Figure 8:
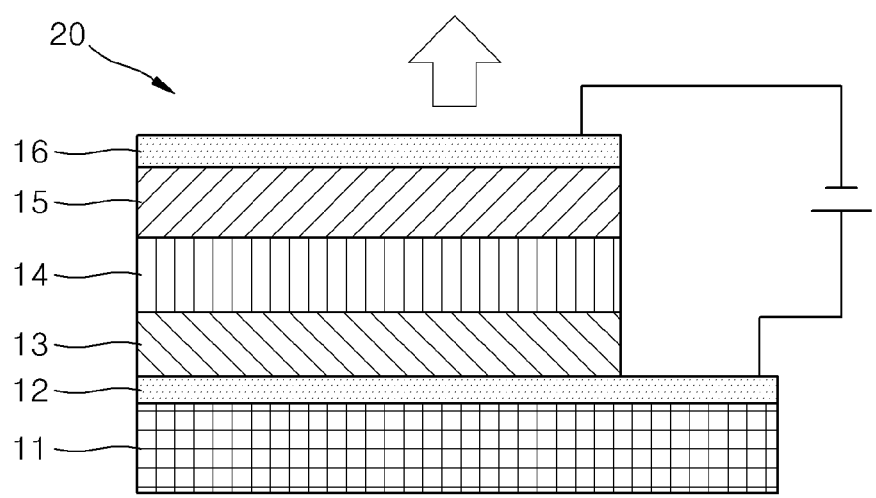
FIG. 8 illustrates another comparative example for comparison with the present embodiment.

Next, a comparative example having a different substrate structure from that of the present embodiment will be described below. FIG. 7 is a sectional view of a comparative example of a bottom emission type OLED 10. FIG. 8 is a sectional view of a comparative example of a top emission type OLED 20.

As illustrated in FIG. 7, the bottom emission type OLED 10 includes a first electrode 12 formed of a transparent conductive film formed of ITO on a substrate 11 formed of glass, by a sputtering method or a resistance heating deposition method, a hole transport layer 13 formed of N,N'-di(1-naphtyl)-N,N'-diphenylbenzidine (hereinafter, referred to as NPD) by the resistance heating deposition method on the first electrode 12, a light-emitting layer 14 formed of 8-hydroxyquinoline aluminum(hereinafter, referred to as $Alq_3$) on the hole transport layer 13 by the resistance heating deposition method, an electron transport layer 15 formed of a metal complex such as tris(8-quinolinolato) aluminum, tris(4-methyl-8-quinolinolato) aluminum, bis(2-methyl-8-quinolinolato)-4-phenylphenolate-aluminum, bis[2-[2-hydroxyphenil]benzoxazolate] zinc on the light-emitting layer 14, and a second electrode 16 formed of a reflection metal film such as aluminum on the electron transport layer 15 by the resistance heating deposition method. When a DC voltage or a DC current is applied between the first electrode 12 of the bottom emission type OLED 10 as a plus electrode and the second electrode 16 as a minus electrode, holes from the first electrode 12 are injected into the light-emitting layer 14 via the hole transport layer 13 and electrons from the second electrode 16 are injected into the light-emitting layer 14 via the electron transport layer 15. The holes and the electrons are recombined in the light-emitting layer 14 and thus excitons generated hereby are transferred from an excitation state to a base state, thereby generating a light-emitting phenomenon.

Referring to FIG. 8, for the top emission type OLED 20, the first electrode 12 is formed of a metal layer having a high reflectance such as aluminum and the second electrode 16 is formed of a transparent conductive film such as ITO, which is different from the structure of the bottom emission type OLED 10. For the top emission type OLED 20, it is general that the first electrode 12 is formed of a reflective metal and the second electrode 16 is formed of a thin film metal or a transparent conductive material. Also, in the bottom emission type OLED 10, the first electrode 12 is formed of a thin film metal or a transparent conductive material and the second electrode 16 is formed of the reflective metal.

The transparent conductive material may be, for example, ITO, tin oxide, zinc oxide, IZO, aluminum-doped zinc oxide (AZO), or gallium-doped zinc oxide (GZO). In addition to the inorganic conductive film, an organic conductive film such as poly(p-phenylenevinylene) derivatives, polyfluorene derivatives, polythiophene derivatives, etc. may be used as a conductive material for forming the transparent electrode. Alternatively, a composite film in a multilayer of the inorganic conductive film and the organic conductive film may be used.

However, when the transparent inorganic conductive film is formed by a sputtering method, light emission is remarkably degraded due to a damage to the organic light-emitting layer by the collision of secondary electrons such as plasma particles or charged particles.

In the OLED 10, light emitted from a fluorescent material in the light-emitting layer 14 exits in all directions from the fluorescent material and is irradiated toward air by passing through the hole transport layer 13, the first electrode 12, and the substrate 11. Alternatively, the light that is emitted in a direction opposite to the light extraction direction, that is, a direction toward the substrate 11, is reflected by the second electrode 16 and is irradiated toward the air by passing through the electron transport layer 15, the light-emitting layer 14, the hole transport layer 13, the first electrode 12, and the substrate 11. However, when the light passes through an interface between media, if a refractive index of a medium at an incident side is greater than that of a medium an exit side, light that is incident at an angle at which an exit angle of a refractive wave is 90°, that is, an angle greater than a critical angle, does not transmit the interface and is totally reflected so that light is not extracted into the air.

A relationship between a refractive angle of light and a refractive index of a medium at an interface between different media generally follows the Snell's law. According to the Snell's law, when light travels from a medium 1 having a refractive index of n1 to a medium 2 having a refractive index of n2, a relation that $n1 \sin \theta1 = n2 \sin \theta2$ is established between an incident angle $\theta1$ and a refractive angle $\theta2$. When a relation that n1>n2 is established in the above relation, an incident angle $\theta1$, at which $\theta2=90°$, ($\theta1 = \text{Arcsin}(n2/n1)$) is referred to as a critical angle. When the incident angle is greater than the critical angle, light is totally reflected at the interface between the medium 1 and the medium 2. Accordingly, in an OLED in which light is isotropically irradiated, the light irradiated at an angle greater than the critical angle repeats total reflection at the interface and thus the light is confined in the device and is not irradiated toward the air.

Figure 9:
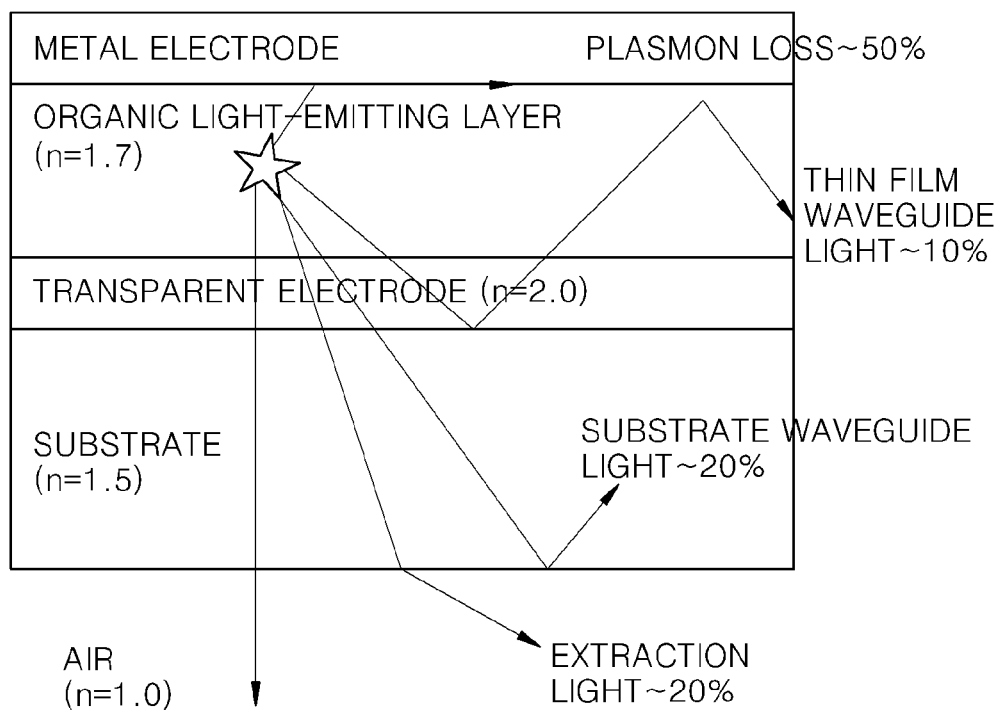
FIG. 9 illustrates ratio of light that is confined in each layer so as not to be extractable and light that is irradiated to the outside, in the comparative example of FIG. 7.

The light extraction rate in the bottom emission type OLED as illustrated in FIG. 7 will be described with reference to FIG. 9. FIG. 9 illustrates ratio of light that is confined in each layer of the OLED so as not to be extractable and light that is irradiated to the outside, through a simple calculation using the Snell's law. In an example of FIG. 9, assuming that the refractive indexes of the hole transport layer and the light-emitting layer forming the OLED are substantially the same, that is, n=7.9, which is collectively indicated as the organic light-emitting layer in FIG. 9. When ITO is used as the transparent electrode, n=2.0. When a glass substrate is used as a substrate, n=1.5.

As illustrated in FIG. 9, a loss of waveguide, that is, a sum of loss of light that is totally reflected between the transparent electrode and the substrate, light that is weakened due to interference between lights reflected between the organic light-emitting layer and the metal electrode, and light that is totally reflected according to a difference in the refractive index between the respective interfaces, that is, according to the Snell's law, and is not extractable to the front surface is about 30%, and the amount of loss of plasmon generated on the surface of the reflective metal is about 50%. As such, light of only about 20% of the generated light is extracted to the outside. Thus, the light extraction efficiency in the OLED according to the comparative example is very low.

Also, when a surface light-emitting device such as an OLED is manufactured, a surface adjacent to the transparent electrode of the substrate requires a high levelness. In most OLEDs configured with a thin film of tens of nanometers to several micrometers, if embossment exists on the surface of the substrate, a current leakage is generated so that stable driving of a device becomes impossible. Thus, when the surface adjacent to the transparent electrode of the substrate, that is, an interface between the transparent conductive film and the substrate, or the transparent electrode itself is not planar, yield of the manufactured OLEDs are deteriorated or the life or reliability of the OLEDs are degraded.

On the other hand, the plasmon loss is generated in a metal surface because of collective excitation of free electrons in metal. Non-radiative transition by an excitation state in the organic light-emitting layer may reduced by increasing a distance from a recombination area of electrons and holes to the surface of a metal.

Figure 10:
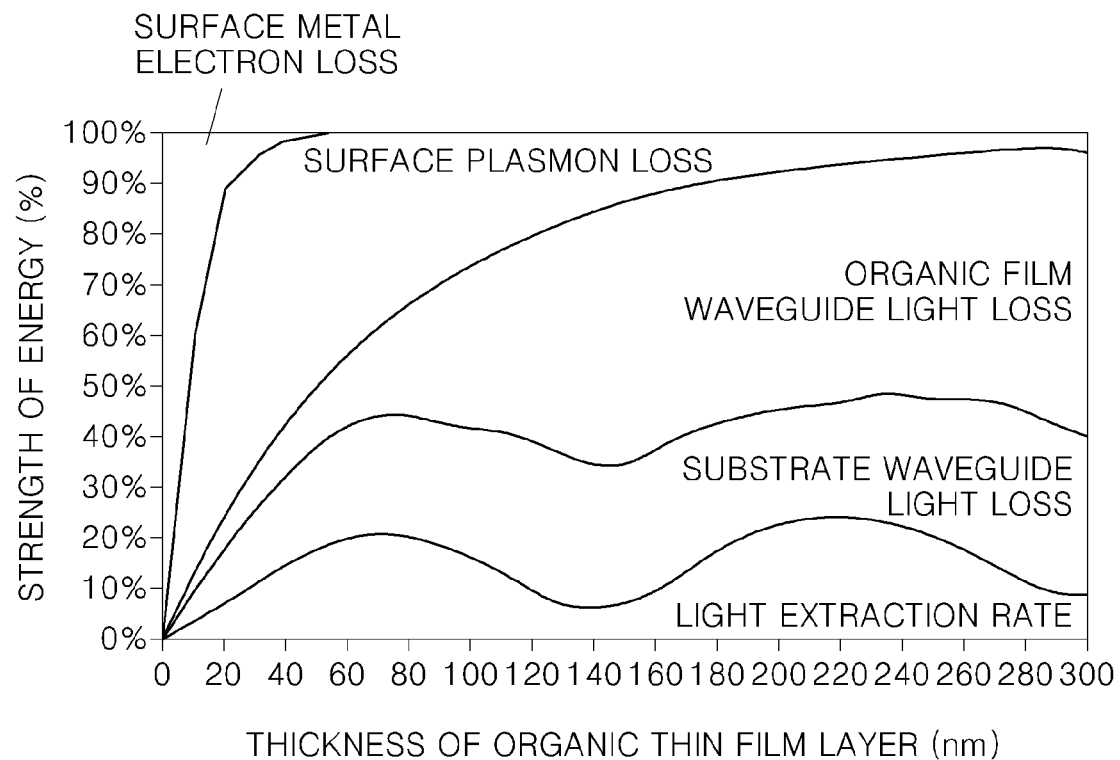
FIG. 10 is a graph showing loss of energy by a stack structure of the comparative example of FIG. 7.

FIG. 10 is a graph showing loss of energy by a stack structure of the OLED of the comparative example. In the stack structure of the OLED of the comparative example, the light strength of plasmon is the maximum on a surface of the reflective metal electrode and monotonously decreases as it is separated far from the reflective metal electrode. Accordingly, in order to reduce the loss of plasmon, a transparent electrode may be used instead of the reflective metal electrode or a light-emitting point is positioned fart from the reflective metal electrode. However, in the case of using a transparent electrode, light use efficiency is degraded because of light emission from the opposite side to an observation direction. Also, since a general transparent electrode is formed of an oxide metal based material, a device characteristic may be deteriorated when a film is formed directly on the organic light-emitting layer. In the latter case, although a certain layer of the organic light-emitting layer, for example, an electron transport layer, may be made thick, it is not useful because a driving voltage increases.

In other words, a lost portion of the light energy due to the substrate, that is, substrate waveguide light loss (substrate mode), and a lost portion of the light energy due to the organic layer, that is, organic layer waveguide light loss (wavelength mode), in the stack structure of the OLED according to the comparative example may be extracted as light in the OLED structure according to the present embodiment.

Next, an OLED 200 according to another embodiment of the present invention will be described below with reference to FIG. 11.

Figure 11:
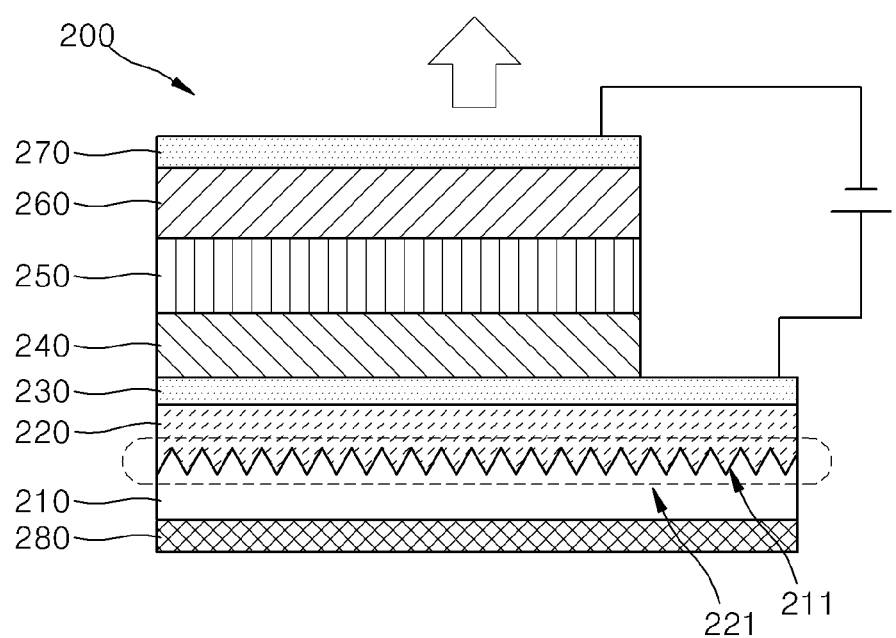
FIG. 11 is a cross-sectional view of an OLED according to another embodiment of the present invention.

FIG. 11 is a cross-sectional view of the OLED 200 according to another embodiment of the present invention. Referring to FIG. 11, the OLED 200 according to the present embodiment is of a top emission type and includes a reflection mirror layer 280, a support substrate 210, a high refractive index layer 220, a first transparent electrode 230 as an anode, a hole transport layer 240, an organic light-emitting layer 250, an electron transport layer 260, and a second transparent electrode 270 as a cathode.

In the OLED 200, an embossed surface 211 is formed on a surface of the support substrate 210 and the surface that contacts the first transparent electrode 230 may be planarized by the high refractive index layer 220. The high refractive index layer 220 of the OLED 200 includes a light dispersion layer 221 having a light dispersion portion provided adjacent to the support substrate 210 to disperse incident light from the first transparent electrode 230. The light dispersion portion, which is an area formed within a dashed line of FIG. 11, is an area around an interface between the support substrate 210 and the high refractive index layer 220 where the embossed surface 211 exists. The light dispersion layer 221 has a predetermined thickness including the light dispersion portion surrounded by the dashed line of FIG. 11.

Since the support substrate 210, the high refractive index layer 220, the first transparent electrode 230, the hole transport layer 240, the organic light-emitting layer 250, the electron transport layer 260, the second transparent electrode 270, the reflection mirror layer 280, and the embossed shape of the embossed surface 211 are the same as the support substrate 110, the high refractive index layer 120, the first transparent electrode 130, the hole transport layer 140, the organic light-emitting layer 150, the electron transport layer 160, the second transparent electrode 170, the reflection mirror layer 180, and the embossed shape of the embossed surface 111, respectively, detailed descriptions thereof will be omitted herein.

An organic light-emitting layer is provided between the first and second transparent electrodes 230 and 270. When the non-metal transparent electrode is formed by a sputtering method, a light emission rate may be degraded according to the damage of the organic light-emitting layer due to the collision of plasma particles or secondary electrons (charged particles). However, in a method of sublimation-forming of a high melting point material by an ion beam sputtering method or an electron beam plasma deposition method, the damage to the organic light-emitting layer may be reduced. Also, according to the present embodiment, loss of plasmon may be reduced or restricted by using a transparent electrode formed of a metal oxide as an anode and a cathode. Thus, according to the present embodiment, the waveguide loss and the plasmon loss may be reduced regardless of the bottom emission type and the top emission type. As a result, light use efficiency may be improved.

Figure 12A:
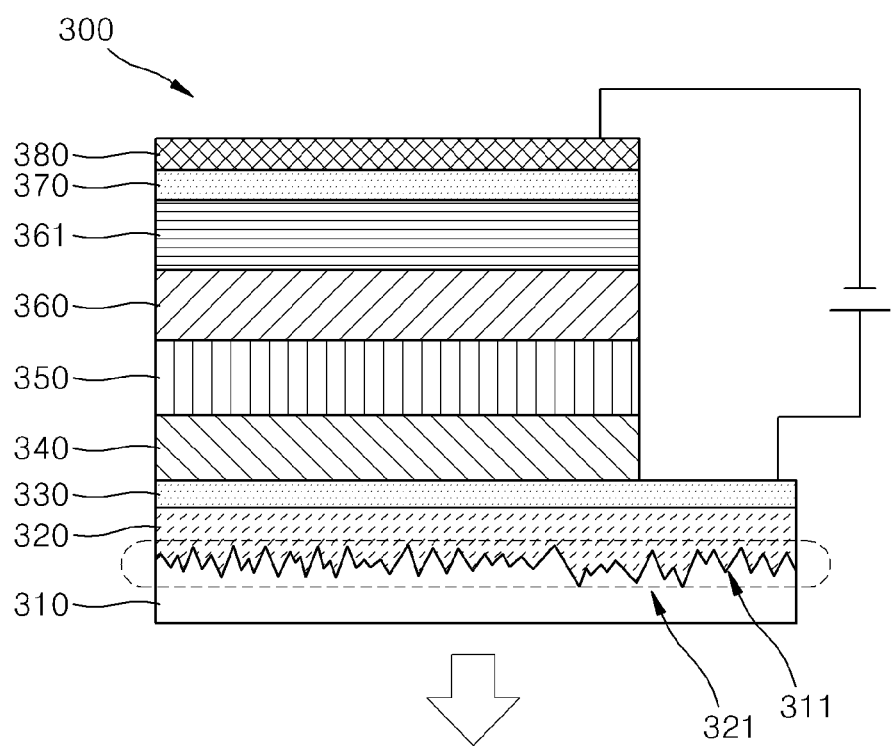
FIG. 12A is a cross-sectional view of an OLED according to another embodiment of the present invention.

FIG. 12A illustrates an OLED 300 according to another embodiment of the present invention. As illustrated in FIG. 12A, the OLED 300 according to the present embodiment is of a bottom emission type. The OLED 300 includes a support substrate 310, a high refractive index layer 320, a first transparent electrode 330 used as an anode, a hole transport layer 340, an organic light-emitting layer 350, an electron transport layer 360, a protection layer 361, a second transparent electrode 370 used as a cathode, and a reflection mirror layer 380. A light-emitting device substrate of the OLED 300 includes the support substrate 310 and the high refractive index layer 320. The high refractive index layer 320 includes a light dispersion layer 321 having a light dispersion portion provided adjacent to the support substrate 310 to disperse incident light from the first transparent electrode 330.

Since the support substrate 310, the high refractive index layer 320, the first transparent electrode 330, the hole transport layer 340, the organic light-emitting layer 350, the electron transport layer 360, the second transparent electrode 370, the reflection mirror layer 380, and the embossed shape of the embossed surface 311 according to the present embodiment are the same as the support substrate 110, the high refractive index layer 120, the first transparent electrode 130, the hole transport layer 140, the organic light-emitting layer 150, the electron transport layer 160, the second transparent electrode 170, the reflection mirror layer 180, and the embossed shape of the embossed surface 111, described with respect to FIG. 1, respectively, detailed descriptions thereof will be omitted herein. The light dispersion portion in the present embodiment, which is an area formed within a dashed line of FIG. 12A, is an area around an interface between the support substrate 310 and the high refractive index layer 320 where the embossed surface 311 exists. The light dispersion layer 321 has a predetermined thickness including the light dispersion portion surrounded by the dashed line of FIG. 12A.

The OLED 300 is different from the OLED 100 of FIG. 1 in that the OLED 300 includes the protection layer 361. The protection layer 361 may be formed of a material capable of injecting or transporting at least one of holes and electrodes. The protection layer 361 may include at least one of, for example, chromium trioxide ($CrO_3$), molybdenum trioxide ($MoO_3$), tungsten trioxide ($WO_3$), vanadium pentoxide ($V_2O_5$), niobium pentoxide ($Nb_2O_5$), tantalum pentoxide ($Ta_2O_5$), and magnesium oxide (MgO). The protection layer 361 may be formed of an inorganic compound and an organic compound other than the above oxides. Also, a multilayer may be formed by using an inorganic compound and an organic compound such as the above oxides and the protection layer 361 may be formed by using the multiplayer.

Figure 12B:
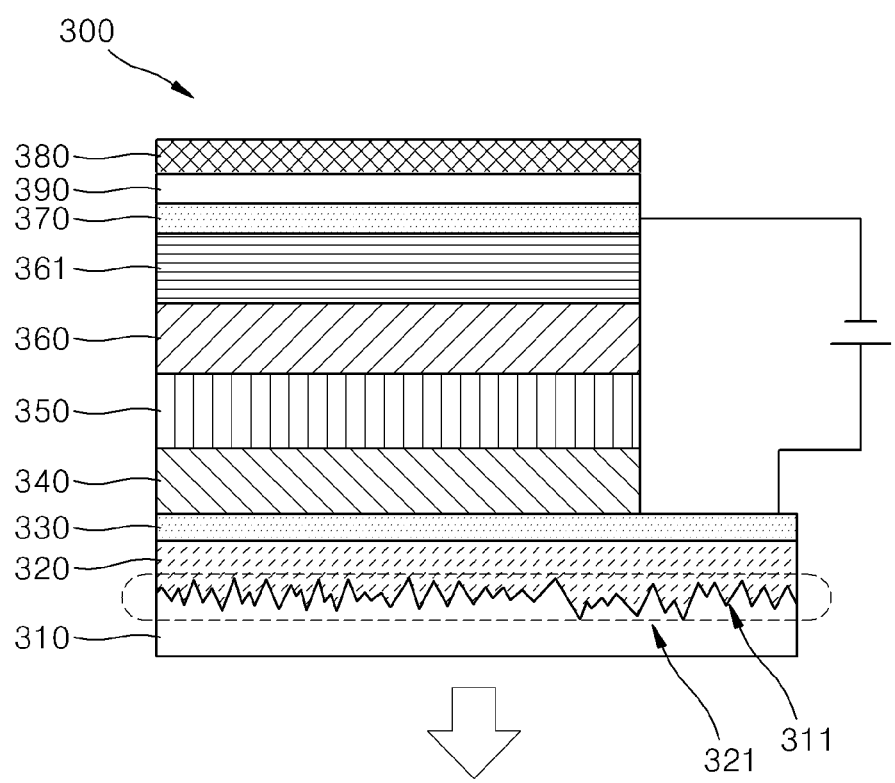
FIG. 12B is a modified example of the OLED of FIG. 12A.

FIG. 12B illustrates a modified example of the OLED 300 of FIG. 12A. In the embodiment of FIG. 12B, a light transmissive charging layer 390 is further provided between the second transparent electrode 370 and the reflection mirror layer 380 of the OLED 300 of FIG. 12A.

The OLED according to the present embodiment may extract the substrate waveguide light loss portion and the organic layer waveguide light loss portion as light, as illustrated in FIG. 6.

FIG. 10 illustrates loss of energy in the OLED stack structure of the comparative example of FIG. 1. A light extraction rate of about 20% may be obtained when the thickness of the organic light-emitting layer is about 50 nm. The other 30% is guided in the substrate and the thin film and the other 50% is lost due to surface plasmon resonance.

In the present embodiment, although an optimal thickness of the transparent electrode at the reflection mirror layer 380 varies according to the physical property values such as a refractive index, an absorption coefficient, a transmissivity, and a resistance rate of the transparent electrode, when ITO or IZO, for example, is in use, the transparent electrode may have a thickness of 30 nm or more to secure a function as an electrode and transparency. For example, the transparent electrode of the reflection mirror layer 380 may have a thickness of 100 nm or more.

As illustrated in FIG. 6, when the "total thickness from a light emitting area to a reflection mirror" is about 100 nm or more, the surface plasmon loss may be about 30% and about 70% of the generated light may be extracted to the outside. The light extraction efficiency may be further improved by further forming the light transmissive charging layer 390 between the transparent electrode adjacent to the reflection mirror layer 380 and the reflection mirror layer 380. In the case of the OLED of FIG. 12B, the light transmissive charging layer 390 may be provided between the second transparent electrode 370 and the reflection mirror layer 380. The upper and lower limits of the thickness of the light transmissive charging layer 390 are not particularly limited.

The light transmissive charging layer 390 may be formed of any one of a light transmissive substrate, an inert gas, vacuum, an organic matter, and an inorganic matter, or a compound thereof. For example, the light transmissive charging layer 390 may be formed of a light transmissive material such as SiOx, SiNx, MoOx, TiOx, TiOx, WOx, etc. The light transmissive charging layer 390 may be formed of, for example, a light transmissive material having a high refractive index, for example, in a range of about 1.5 to about 2.0.

Figure 13:
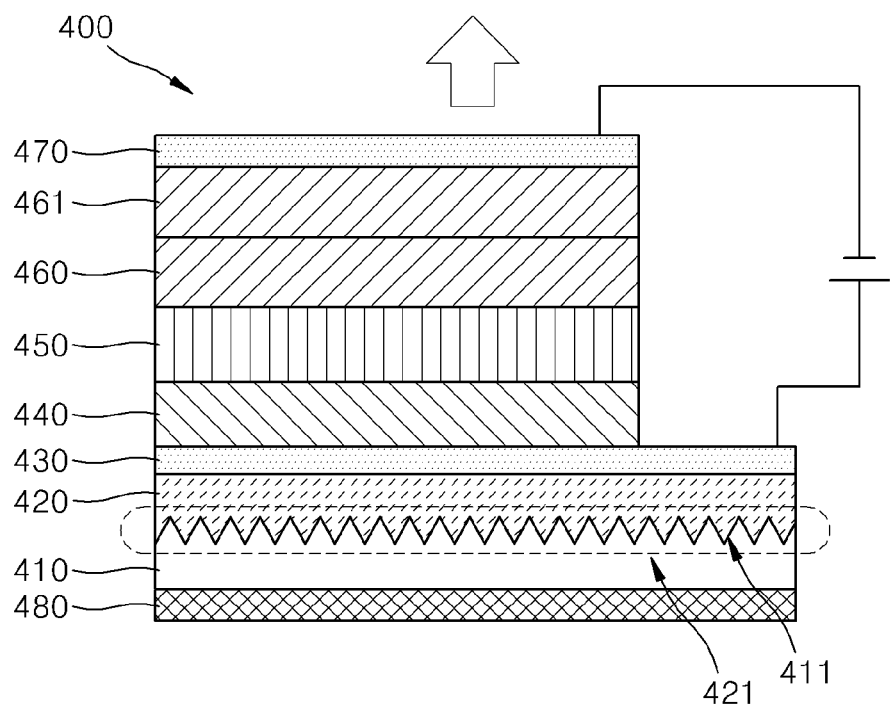
FIG. 13 is a cross-sectional view of an OLED according to another embodiment of the present invention.

FIG. 13 illustrates an OLED 400 according to another embodiment of the present invention. As illustrated in FIG. 13, the OLED 400 according to the present embodiment is of a top emission type. The OLED 400 according to the present embodiment includes a reflection mirror layer 480, a support substrate 410, a high refractive index layer 420, a first transparent electrode 430 used as an anode, a hole transport layer 440, an organic light-emitting layer 450, an electron transport layer 460, a protection layer 461, a second transparent electrode 470 used as a cathode. A light-emitting device substrate according to the present embodiment includes the support substrate 410 and the high refractive index layer 420. The high refractive index layer 420 includes a light dispersion layer 421 having a light dispersion portion provided adjacent to the support substrate 410 to disperse incident light from the first transparent electrode 430.

Since the support substrate 410, the high refractive index layer 420, the first transparent electrode 430, the hole transport layer 440, the organic light-emitting layer 450, the electron transport layer 460, the second transparent electrode 470, the reflection mirror layer 480, and the embossed shape of the embossed surface 411 according to the present embodiment are the same as the support substrate 210, the high refractive index layer 220, the first transparent electrode 230, the hole transport layer 240, the organic light-emitting layer 250, the electron transport layer 260, the second transparent electrode 270, the reflection mirror layer 280, and the embossed shape of the embossed surface 211, described with respect to FIG. 11, respectively, detailed descriptions thereof will be omitted herein. The light dispersion portion in the present embodiment, which is an area formed within a dashed line of FIG. 13, is an area around an interface between the support substrate 410 and the high refractive index layer 420 where the embossed surface 421 exists. The light dispersion layer 421 has a predetermined thickness including the light dispersion portion surrounded by the dashed line of FIG. 13.

The OLED 400 is different from the OLED 100 according to the embodiment of FIG. 1 in that the OLED 400 has the protection layer 461. Since the protection layer 461 may be configured as the protection layer 361 included in the OLED 300 of FIG. 12A, a detailed description thereof will be omitted herein.

Since the OLED 300 and the OLED 400 include the protection layers, they can further restrict loss of light compared to the OLED 100 and the OLED 200.

According to the embodiments of the present invention, non-metal materials are used for the first and second transparent electrodes and thus loss of plasmon may be reduced or restricted. Also, by using the light dispersion substrate, light extraction loss in both of the thin film mode and the substrate mode may be reduced. Accordingly, according to the present invention, both of the waveguide loss and the plasmon loss may be reduced regardless of the bottom emission type and the top emission type and as a result light use efficiency may be improved.

Next, the present invention will be described further in detail by using an embodiment, but the present invention is not limited to the following embodiment.

(Manufacturing of a Light-emitting Substrate)

A light-emitting device substrate used as a substrate for an OLED is manufactured. For example, soda-lime glass having a thickness of about 9.7 mm and a size of about 50×50 mm is used as the support substrate. A support substrate with embossment (hereinafter, referred to as an embossed substrate) by injecting onto the soda-lime glass aluminum powder #800 under a condition of 0.5 kPa. A surface of the embossed surface is observed by using a laser microscope VK9510 by Keyence and it is found that embossment (Ra=0.7 μm) is formed. When the surface is observed by using a Haze meter "Haze Guard II" by Toyo Seiki Co., Ltd., it is observed that an embossed surface functioning as a light dispersion portion and having transmissivity of about 82% and the Haze value of about 91% is formed.

Apart from the above, $Bi_2O_3$—$B_2O_3$—$ZnO$ based glass frit (particle size distribution D50=1.6 μm) of 150 g, ethyl cellulose STD45 (Dow Chemical product) of 3 g, terpineol of 32.9 g, and butyl carbitol acetate of 14.1 g are dissolved and mixed and then roll milling mixed by using three roll mills, thereby manufacturing a glass paste composition.

The obtained glass paste composition is coated on each of the above-manufactured substrate with embossment and the substrate without embossment (soda-lime glass substrate without being sandblast processed) by using doctor blade. Then, the solvent is removed by using a hot wind drier blowing hot wind of about 120° C. The processed substrates are transferred to a burning furnace and burned at about 350° C. for about 30 minutes, thereby removing binder resin. Then, the substrates are burned at about 500° C. for about 30 minutes and thus a high refractive index layer that is a transparent glass layer is formed on a surface of each substrate.

The thickness of the high refractive index layer formed on the substrate without embossment is measured to be about 30 μm by using an electronic stylus film thickness meter (Dektak) by Arubak. In other words, a glass layer (high refractive index layer) that is colorless and transparent and has a planar surface is formed. The Ra of the substrate where the high refractive index layer is formed is about 30 nm or less.

When the high refractive index layer is formed on the substrate without embossment, a total transmitted light rate of the substrate that is burned in the atmosphere (atmospheric burning) is about 72.2% and the Haze value thereof is about 40.2% (see Item (1) Air in Table 1). Also, when the high refractive index layer is formed on the substrate without embossment, a total transmitted light rate of the substrate that is burned in vacuum (vacuum burning) is about 82.3% and the Haze value thereof is about 2.66% (see Item (2) Vacuum in Table 1). The transmissivity and the Haze value of each substrate are shown in Table 1.

TABLE 1

|  | Transmissivity [%] | Haze value [%] |
| --- | --- | --- |
| Ref. (glass) | 91.7 | 0.15 |
| (1) Air | 72.2 | 40.2 |
| (2) Vacuum | 82.7 | 2.66 |

Also, the vacuum burned substrate is manufactured with an additional grinding process for further planarizing a surface.

Next, a film having a thickness of about 120 nm is formed of ITO on soda-lime glass and the above three types of glass substrates by using an RF magnetron sputtering apparatus.

Embodiments

An OLED is manufactured as follows by using a light-emitting device substrate that is manufactured by the above method.

(Embodiment 1)

As embodiment 1, an OLED having a structure of FIG. 1 is manufactured as follows.

First, after an ITO film as an anode is formed to have a thickness of about 120 nm by sputtering on the above manufactured light dispersion substrate, a cleaning process such as a brush cleaning, ultrasound cleaning, skimming, etc. is performed and an ultraviolet light/ozone cleaning (hereinafter, referred to as the UV/$O_3$ cleaning). Next, a mono(8-quinolinolato)lithium complex (hereinafter, referred to as Liq) layer as an electron injection layer, a tris(8-quinolinol)aluminum (hereinafter, referred to as $Alq_3$) layer as a light-emitting layer, and a naphtha substituted diamine derivative (hereinafter, referred to as α-NPD) layer as a hole transport layer are sequentially vacuum deposited. Then, an ITO film as a cathode and an aluminum (Al) layer as a reflection mirror are formed by sputtering, respectively, to have thicknesses of about 100 nm and about 50 nm. Finally, an encapsulation plate to which a calcium oxide based desiccant is added is combined to a stack structure surface including the light dispersion substrate and an entire lateral surface thereof by using UV curable resin and the resin is cured by irradiating an ultraviolet ray thereto, thereby obtaining the OLED of embodiment 1.

(Embodiment 2)

As embodiment 2, the OLED having the structure as illustrated in FIG. 11 is manufactured as follows.

After an ITO film as an anode is formed to have a thickness of about 120 nm by sputtering on the light dispersion substrate manufactured as described above, an Al layer as a reflection mirror is formed to have a thickness of about 50 nm by sputtering on the other surface of the light dispersion substrate, that is, a surface where the anode is not formed. Then, a cleaning process such as brush cleaning, ultrasound cleaning, skimming, etc. is performed and then a UV/O$_3$ cleaning process is performed. Next, a Liq layer as an electron injection layer, an Alq$_3$ layer as a light-emitting layer, and an α-NPD layer as a hole transport layer are sequentially vacuum deposited. Then, an ITO film as a cathode is formed by sputtering to have a thickness of about 100 nm. Finally, an encapsulation plate to which a calcium oxide based desiccant is added is combined to a stack structure surface including the light dispersion substrate and an entire lateral surface thereof by using UV curable resin and the resin is cured by irradiating an ultraviolet ray thereto, thereby obtaining the OLED of embodiment 2.

(Embodiment 3)

As embodiment 3, the OLED having the structure as illustrated in FIG. 12A is manufactured as follows.

After an ITO film as an anode is formed to have a thickness of about 120 nm by sputtering on the light dispersion substrate manufactured as described above, the ITO film undergoes a cleaning process such as brush cleaning, ultrasound cleaning, skimming, etc. and then a UV/O$_3$ cleaning process. Next, a Liq layer as an electron injection layer, an Alq$_3$ layer as a light-emitting layer, an α-NPD layer as a hole transport layer, and a MoO$_3$ layer as a protection layer are sequentially vacuum deposited. Then, an ITO film as a cathode and an Al layer as a reflection mirror are formed by sputtering, respectively, to have thicknesses of about 100 nm and about 50 nm. Finally, an encapsulation plate to which a calcium oxide based desiccant is added is combined to a stack structure surface including the light dispersion substrate and an entire lateral surface thereof by using UV curable resin and the resin is cured by irradiating an ultraviolet ray thereto, thereby obtaining the OLED of embodiment 3.

(Embodiment 4)

As embodiment 4, the OLED having the structure as illustrated in FIG. 13 is manufactured as follows.

After an ITO film as an anode is formed to have a thickness of about 120 nm by sputtering on the light dispersion substrate manufactured as described above, an Al layer as a reflection mirror is formed to have a thickness of about 50 nm by sputtering on the other surface of the light dispersion substrate, that is, a surface where the anode is not formed. Then, a cleaning process such as brush cleaning, ultrasound cleaning, skimming, etc. is performed and then a UV/O$_3$ cleaning is performed. Next, a Liq layer as an electron injection layer, an Alq$_3$ layer as a light-emitting layer, an α-NPD layer as a hole transport layer, and a MoO$_3$ layer as a protection layer are sequentially vacuum deposited. Then, an ITO film as a cathode is formed by sputtering to have a thickness of about 100 nm. Finally, an encapsulation plate to which a calcium oxide based desiccant is added is combined to a stack structure surface including the light dispersion substrate and an entire lateral surface thereof by using UV curable resin and the resin is cured by irradiating an ultraviolet ray thereto, thereby obtaining the OLED of embodiment 4.

COMPARATIVE EXAMPLES

The following comparative example is manufactured to check a degree of the light extraction efficiency according to the embodiments 1 to 4.

Comparative Example 1

As comparative example 1, the bottom emission type OLED illustrated in FIG. 7 is manufactured as follows. Those used in embodiments 1 to 4 are used as a light dispersion substrate.

After an ITO film as an anode is formed to have a thickness of about 120 nm by sputtering on the light dispersion substrate manufactured as described above, the ITO film undergoes a cleaning process such as brush cleaning, ultrasound cleaning, skimming, etc. and then a UV/O$_3$ cleaning process. Next, a Liq layer as an electron injection layer, an Alq$_3$ layer as a light-emitting layer, an α-NPD layer as a hole transport layer, and a MoO$_3$ layer as a protection layer are sequentially vacuum deposited. Then, an Al layer as a cathode is formed by vacuum deposition sputtering, to have a thickness of about 70 nm. Finally, an encapsulation plate to which a calcium oxide based desiccant is added is combined to a stack structure surface including the light dispersion substrate and an entire lateral surface thereof by using UV curable resin and the resin is cured by irradiating an ultraviolet ray thereto, thereby obtaining the bottom emission type OLED of comparative example 1.

Comparative Example 2

As comparative example 2, the top emission type OLED illustrated in FIG. 8 is manufactured.

An Al layer as a reflection mirror is formed to have a thickness of about 50 nm by sputtering on a cleaned glass substrate, and an ITO film as an anode is formed to have a thickness of about 120 nm by sputtering on the al layer. Then, a cleaning process such as brush cleaning, ultrasound cleaning, skimming, etc. is performed and then a UV/O$_3$ cleaning is performed. Next, a Liq layer as an electron injection layer, an Alq$_3$ layer as a light-emitting layer, and an α-NPD layer as a hole transport layer are sequentially vacuum deposited. Then, an ITO film as a cathode is formed by sputtering to have a thickness of about 100 nm. Finally, an encapsulation plate to which a calcium oxide based desiccant is added is combined to a stack structure surface including the light dispersion substrate and an entire lateral surface thereof by using UV curable resin and the resin is cured by irradiating an ultraviolet ray thereto, thereby obtaining the top emission type OLED of comparative example 2.

(Measurement of Light Extraction Efficiency)

Regarding embodiments 1 to 4 according to the present invention and comparative examples 1 and 2, a current-voltage-luminance characteristic is measured by combining a source meter by Keithkey and a luminance meter "Spectra ScanPR600" by Photo Research. Also, the extraction efficiency is indicated by a relative evaluation with the extraction efficiency of comparative example 1 of "1". A result of the measurement is shown in Tables 2 and 3.

TABLE 2

| Bottom Emission | Luminance Ratio |
|---|---|
| Comparative Example 1 | 1.000 |
| Embodiment 1 | 1.427 |
| Embodiment 3 | 1.784 |

TABLE 3

| Top Emission | Luminance Ratio |
|---|---|
| Comparative Example 2 | 1.000 |
| Embodiment 2 | 1.389 |
| Embodiment 4 | 1.644 |

As shown in Table 2 the bottom emission type OLED according to an embodiment of the present invention has luminance of about 1.4 to 1.6 times higher than that of the bottom emission type OLED according to the comparative example. Also, as shown in Table 3, the top emission type OLED according to an embodiment of the present invention has luminance of about 1.3 to 1.6 times higher than that of the top emission type OLED according to the comparative example.

As described above, in the OLED according to an embodiment of the present invention, the first transparent electrode formed between the support substrate and the organic light-emitting electrode and the second transparent electrode formed on an upper surface of the organic light-emitting layer both are not formed of metal having a high reflectance such as aluminum or an alloy. Also, the OLED according to an embodiment of the present invention has a structure in which the first transparent electrode or the second transparent electrode is provided between the reflection mirror layer and the organic light-emitting layer. According to Table 1, the light extraction efficiency of the OLED according to an embodiment of the present invention may be improved.

The OLED according to an embodiment of the present invention includes an organic light-emitting layer, a protection layer, and a transparent electrode. As a reflection mirror layer or a light transmissive charging layer and a reflection mirror layer are provided at one side of the organic light-emitting layer, plasma loss may be reduced. Also, by a combination with the light dispersion substrate, the light that may not be extracted from the front surface of the substrate may be extracted from the front surface of the substrate according to the Snell's law and thus the light extraction efficiency may be improved.

Also, since a distance between the light-emitting layer and the reflection layer is increased and a space therebetween may be filled with inert gas, vacuum, an organic material, or an inorganic material, a distance over an optical wavelength may be simply obtained.

Also, when a damage to the organic light-emitting layer may be reduced by including the protection layer, and a transparent electrode is formed by using an ion beam sputtering method, an electron beam plasma deposition method, an electrostatic spray method, etc., no damage is applied to the organic light-emitting layer so that a device characteristic may be deteriorated.

Also, since the light emitting device substrate has a light extraction structure, yield is not deteriorated.

In the present invention, a high refractive index layer having a light dispersion function to improve extraction efficiency is formed on a surface of the support substrate. The light-emitting substrate is formed by using a glass paste composition including low-melting point glass frit having a refractive index over a refractive index of the support substrate as a planarization material for planarizing an interface with the first transparent electrode. Since a reflection mirror layer is formed on the opposite side of the light extraction surface, plasmon loss may be reduced or restricted and thus light extraction loss may be reduced.

In the prevent invention, the light extraction efficiency may be improved by separating the light-emitting portion and the reflection layer by the protection layer.

Also, in the present invention, the transparent electrode may be formed by processing a high melting material using a sublimation film forming method such as an ion beam sputtering method or an electron beam plasma deposition method. Thus, a damage to the organic light-emitting layer may be reduced and the organic light-emitting layer may be directly formed on the second transparent electrode.

Also, since a protection layer is formed between the organic light-emitting layer and the second transparent electrode, the damage to the organic light-emitting layer may be restricted when the sublimation film forming method is used.

It should be understood that the exemplary embodiments described herein should be considered in a descriptive sense only and not for purposes of limitation. Descriptions of features or aspects within each embodiment should typically be considered as available for other similar features or aspects in other embodiments.

What is claimed is:

1. An organic electroluminescence device comprising:
   a support substrate;
   a first transparent electrode on the support substrate;
   an organic light-emitting layer on the first transparent electrode;
   a second transparent electrode on the organic light-emitting layer; and
   a high refractive index layer arranged between the support substrate and the first transparent electrode, having at least one layer having a refractive index greater than or equal to a refractive index of the support substrate, having a light dispersion portion for dispersing incident light from the organic light-emitting layer, and having a planar surface contacting the first transparent electrode,
   wherein the support substrate comprises an embossed surface, and
   wherein the high refractive index layer has a thickness of greater than or equal to about 30 times and less than or equal to about 40 times of an average surface roughness Ra of the embossed surface.

2. The organic electroluminescence device of claim 1, further comprising a protection layer between the organic light-emitting layer and the second transparent electrode.

3. The organic electroluminescence device of claim 1, wherein each of the first transparent electrode and the second transparent electrode is formed of a metal oxide.

4. The organic electroluminescence device of claim 1, wherein each of the first transparent electrode and the second transparent electrode has a thickness of greater than or equal to about 30 nm.

5. The organic electroluminescence device of claim 1, wherein the average surface roughness Ra of the embossed surface is greater than or equal to about 0.7 μm and less than or equal to about 5 μm.

6. The organic electroluminescence device of claim 1, wherein the high refractive index layer has a thickness of greater than or equal to about 1.3 times of a maximum surface roughness Rz of the embossed surface.

7. The organic electroluminescence device of claim 1, wherein a thickness of the high refractive index layer is greater than or equal to about 3 μm and less than or equal to about 100 μm.

8. A backlight comprising the organic electroluminescence device according to claim 1.

9. An illumination apparatus comprising the organic electroluminescence device according to claim 1.

10. A display comprising the organic electroluminescence device according to claim 1.

11. The organic electroluminescence device of claim 1, wherein a diameter of an air bubble existing in the high refractive index layer is less than or equal to $1/10$ of a thickness of a layer adjacent to the first transparent electrode among layers forming the high refractive index layer.

12. The organic electroluminescence device of claim 11, wherein a rate in a size of a horizontal section of the air bubble with respect to an entire area of a horizontal section of the high refractive index layer is less than or equal to 0.5%, and a rate in a size of a vertical section of the air bubble with respect to an entire area of a vertical section of the high refractive index layer is less than or equal to 0.5%.

13. An organic electroluminescence device comprising:
a support substrate;
a first transparent electrode on the support substrate;
an organic light-emitting layer on the first transparent electrode;
a second transparent electrode on the organic light-emitting layer;
a high refractive index layer arranged between the support substrate and the first transparent electrode, having at least one layer having a refractive index greater than or equal to a refractive index of the support substrate, having a light dispersion portion for dispersing incident light from the organic light-emitting layer. and having a planar surface contacting the first transparent electrode;
a reflection mirror layer that is provided at a side opposite to a surface where light from the organic light-emitting layer is extracted; and
a light transmissive charging layer that is provided between the second transparent electrode and the reflection mirror layer,
wherein the support substrate comprises an embossed surface.

14. The organic electroluminescence device of claim 13, wherein the light transmissive charging layer is formed of SiOx, SiNx, MoOx, TiOx, TiOx, or WOx.

15. The organic electroluminescence device of claim 13, wherein the reflection mirror layer comprises a dielectric multilayer film.

16. A method of manufacturing an organic electroluminescence device, the method comprising:
forming an embossed surface on a support substrate;
forming a high refractive index layer on the support substrate;
planarizing a surface of the high refractive index layer by using a glass paste composition including glass frit having a refractive index of greater than or equal to a refractive index of the support substrate;
forming a first transparent electrode on the high refractive index layer;
forming an organic light-emitting layer on the first transparent electrode; and
forming a second transparent electrode on the organic light-emitting layer,
wherein the high refractive index layer has a thickness of greater than or equal to about 30 times and less than or equal to about 40 times of an average surface roughness Ra of the embossed surface.

17. The method of claim 16, further comprising a reflection mirror layer at a side opposite to a surface where light is extracted from the organic light-emitting layer.

* * * * *